(12) United States Patent
Hoshi

(10) Patent No.: US 12,408,390 B2
(45) Date of Patent: Sep. 2, 2025

(54) SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 556 days.

(21) Appl. No.: 17/830,143

(22) Filed: Jun. 1, 2022

(65) Prior Publication Data
US 2022/0399438 A1  Dec. 15, 2022

(30) Foreign Application Priority Data

Jun. 15, 2021  (JP) .................................. 2021-099728
Dec. 24, 2021  (JP) .................................. 2021-210097

(51) Int. Cl.
*H10D 30/66* (2025.01)
*H01L 21/04* (2006.01)
(Continued)

(52) U.S. Cl.
CPC ........ *H10D 62/111* (2025.01); *H01L 21/0465* (2013.01); *H01L 21/7602* (2013.01);
(Continued)

(58) Field of Classification Search
CPC .. H10D 62/111; H10D 30/668; H10D 62/393; H10D 62/107
See application file for complete search history.

(56) References Cited

U.S. PATENT DOCUMENTS

2010/0224932 A1\*  9/2010  Takaya ................. H10D 30/668
                                                         257/E21.334
2018/0033876 A1\*  2/2018  Sugahara ............. H10D 64/513
(Continued)

FOREIGN PATENT DOCUMENTS

| JP | 2016225455 A | 12/2016 |
|---|---|---|
| JP | 6266166 B2 | 1/2018 |
| WO | 2017064949 A1 | 4/2017 |

*Primary Examiner* — Michele Fan
(74) *Attorney, Agent, or Firm* — Rabin & Berdo, P.C.

(57) ABSTRACT

P-type low-concentration regions face bottoms of trenches and extend in a longitudinal direction (first direction) of the trenches. The p-type low-concentration regions are adjacent to one another in a latitudinal direction (second direction) of the trenches and connected at predetermined locations by p-type low-concentration connecting portions that are scattered along the first direction and separated from one another by an interval of at least 3 μm. The p-type low-concentration regions and the p-type low-concentration connecting portions have an impurity concentration in a range of $3\times10^{17}/\text{cm}^3$ to $9\times10^{17}/\text{cm}^3$. A depth from the bottoms of the trenches to lower surfaces of the p-type low-concentration regions is in a range of 0.7 μm to 1.1 μm. Between the bottom of each of the trenches and a respective one of the p-type low-concentration regions, a p$^+$-type high-concentration region is provided. Each p$^+$-type high-concentration region has an impurity concentration that is at least 2 times the impurity concentration of the p-type low-concentration regions.

19 Claims, 24 Drawing Sheets

(51) Int. Cl.
  *H01L 21/76* (2006.01)
  *H01L 21/761* (2006.01)
  *H10D 12/01* (2025.01)
  *H10D 62/10* (2025.01)
  *H10D 62/17* (2025.01)
  *H10D 62/832* (2025.01)

(52) U.S. Cl.
  CPC ......... *H01L 21/761* (2013.01); *H10D 12/031* (2025.01); *H10D 30/668* (2025.01); *H10D 62/393* (2025.01); *H10D 62/8325* (2025.01)

(56) References Cited

U.S. PATENT DOCUMENTS

| | | |
|---|---|---|
| 2018/0076285 A1 | 3/2018 | Tanaka et al. |
| 2018/0151366 A1 | 5/2018 | Endo et al. |
| 2018/0175149 A1* | 6/2018 | Takaya ................. H10D 12/031 |
| 2018/0197983 A1 | 7/2018 | Kinoshita et al. |
| 2018/0331185 A1* | 11/2018 | Mori ................... H10D 62/116 |
| 2019/0067420 A1* | 2/2019 | Takaya ................... H10D 64/01 |
| 2019/0074373 A1* | 3/2019 | Kobayashi ........... H10D 62/157 |
| 2019/0109227 A1* | 4/2019 | Kobayashi ........... H10D 62/155 |
| 2019/0109228 A1* | 4/2019 | Kobayashi ........... H10D 62/107 |
| 2019/0140091 A1* | 5/2019 | Kinoshita .......... H10D 30/0297 |
| 2019/0140094 A1* | 5/2019 | Kurokawa ........... H10D 62/393 |

* cited by examiner (1)

SEMICONDUCTOR DEVICE

CROSS REFERENCE TO RELATED APPLICATIONS

This application is based upon and claims the benefit of priority of the prior Japanese Patent Application Nos. 2021-099728, filed on Jun. 15, 2021, and 2021-210097, filed on Dec. 24, 2021, the entire contents of which are incorporated herein by reference.

BACKGROUND OF THE INVENTION

1. Field of the Invention

Embodiments of the invention relate to a semiconductor device.

2. Description of the Related Art

Among power semiconductor devices that control high voltage and/or large current, there are several types such as bipolar transistors, insulated gate bipolar transistors (IGBTs), and metal oxide semiconductor field effect transistors (MOSFETs) that have insulated gates (MOS gates) having a 3-layer structure including a metal, an oxide film, and a semiconductor; these devices are selectively used according to an intended purpose.

For example, bipolar transistors and IGBTs have high current density compared to MOSFETs and can be adapted for large current but cannot be switched at high speeds. In particular, the limit of switching frequency is about several kHz for bipolar transistors and about several tens of kHz for IGBTs. On the other hand, MOSFETs have low current density compared to bipolar transistors and IGBTs and are difficult to adapt for large current but can be switched at high speeds up to about several MHz.

Further, a MOSFET, unlike an IGBT, has a built-in parasitic diode (body diode) formed by pn junctions (main junctions) between an n$^-$-type drift region and p-type base regions in a semiconductor substrate (semiconductor chip). The MOSFET may use the parasitic diode built in the semiconductor substrate to function as a freewheeling diode for protecting the MOSEFT. Therefore, the MOSFET is also attracting attention economically because additional connection of an external freewheel diode is unnecessary.

While silicon (Si) is used as material for fabricating power semiconductor devices, there is a strong demand in the market for large-current, high-speed power semiconductor devices and thus, IGBTs and power MOSFETs have been intensively developed and improved, and the performance of power devices has substantially reached the theoretical limit determined by the material. Therefore, in terms of power semiconductor devices, semiconductor materials to replace silicon have been investigated and silicon carbide (SiC) has been focused on as a semiconductor material enabling fabrication (manufacture) of next-generation power semiconductor devices having low ON voltage, high-speed characteristics, and high-temperature characteristics.

SiC is a very stable semiconductor material chemically, has a wide bandgap of 3 eV, and can be used very stably as a semiconductor material even at high temperatures. Further, SiC has a critical electric field strength that is at least ten times that of silicon and therefore, is expected to be a semiconductor material capable of sufficiently reducing ON resistance. Such characteristics of silicon carbide are also applicable to other semiconductors having a band gap wider than a band gap of silicon (hereinafter, wide band gap semiconductors).

Further, in a MOSFET, use of a trench gate structure in which, accompanying large current, a channel is formed along a trench sidewall in a direction orthogonal to a front surface of a semiconductor chip is advantageous in terms of cost as compared to a planar gate structure in which a channel (inversion layer) is formed along the front surface of the semiconductor chip. A reason for this is that the trench gate structure enables the unit cell (constituent unit of a device element) density per unit area to be increased, whereby the current density per unit area may be increased to a greater extent than with the planar gate structure.

The rate of temperature increase relative to the area occupied by the unit cells increases according to the extent to which the current density per unit area is increased and therefore, to enhance discharge efficiency and stabilize reliability, a double-sided cooling structure is necessary. A double-sided cooling structure is a cooling structure in which rod-shaped terminal pins are bonded vertically in an upright position to an aluminum (Al) electrode film of a front surface of a semiconductor substrate, and a drain pad of a back surface of the semiconductor substrate is bonded to cooling fins via a metal base plate of an insulated substrate, whereby heat generated by the semiconductor substrate is dissipated from both main surfaces of the semiconductor substrate.

A structure of a conventional semiconductor device is described. FIGS. 17, 18, 19, and 20 are cross-sectional views depicting the structure along cutting line AA1-AA1', cutting line AA2-AA2', cutting line BB1-BB1', and cutting line BB2-BB2' in FIG. 21, respectively. FIG. 21 is a plan view depicting a layout when a portion of the conventional semiconductor device is viewed from a front side of a semiconductor substrate. In FIG. 21, first and second p$^+$-type high-concentration regions 261, 262 are outlined by thick broken lines and filled with hatching while p$^+$-type high-concentration connecting portions 263 are outlined by solid lines and filled with hatching.

A conventional semiconductor device 230 depicted in FIGS. 17 to 21 is a vertical MOSFET that includes a general trench gate structure on a front side of a semiconductor substrate (semiconductor chip) 210 that contains silicon carbide. The semiconductor substrate 210 is formed by sequentially forming silicon carbide layers 212, 213 on a front surface of an n$^+$-type starting substrate 211 containing silicon carbide, the silicon carbide layers 212, 213 being formed by epitaxial grown and constituting an n$^-$-type drift region 232 and a p-type base region 234, respectively. The semiconductor substrate 210 has a main surface that is a surface of the p-type silicon carbide layer 213, assumed as a front surface, and a main surface that is a surface of the n$^+$-type starting substrate 211, assumed as a back surface.

The trench gate structure is configured by the p-type base region 234, n$^+$-type source regions 235, p$^{++}$-type contact regions 236, trenches 237, a gate insulating film 238, and gate electrodes 239. Multiple unit cells (functional units of a device element) of the MOSFET are disposed adjacent to one another, the trenches 237 of the unit cells being disposed in a striped pattern extending in a first direction X that is parallel to the front surface of the semiconductor substrate 210. The p-type base region 234, the n$^+$-type source regions 235 and the p$^{++}$-type contact regions 236 are selectively provided between the trenches 237, which are adjacent to one another.

In the semiconductor substrate 210, the first and the second p$^+$-type high-concentration regions 261, 262 that mitigate electric field applied to bottoms of the trenches 237 are provided at depth positions closer to an n$^+$-type drain region 231 are than the bottoms of the trenches 237. The first and the second p$^+$-type high-concentration regions 261, 262 are disposed in a striped pattern extending in a linear shape along a longitudinal direction (the first direction X) of the trenches 237. The first p$^+$-type high-concentration regions 261 are provided separate from the p-type base region 234 and face the bottoms of the trenches 237 in a depth direction Z.

The second p$^+$-type high-concentration regions 262 are provided between the trenches 237, which are adjacent to one another, the second p$^+$-type high-concentration regions 262 being separate from the first p$^+$-type high-concentration regions 261 and the trenches 237. The second p$^+$-type high-concentration regions 262 are in contact with the p-type base region 234 and in a direction of the n$^+$-type drain region 231, reach a depth substantially equal to that of the first p$^+$-type high-concentration regions 261. Each of the first p$^+$-type high-concentration regions 261 is connected, at a predetermined location, to an adjacent one of the second p$^+$-type high-concentration regions 262 by one of the p$^+$-type high-concentration connecting portions 263 that have an impurity concentration equal to that of the first and the second p$^+$-type high-concentration regions 261, 262.

Portions of the adjacent first and the second p$^+$-type high-concentration regions 261, 262 form the p$^+$-type high-concentration connecting portions 263 and do not constitute paths for current that flows from the n$^+$-type drain region 231 to the n$^+$-type source regions 235, through channels (n-type inversion layers) formed along the sidewalls of the trenches 237 when the MOSFET is on. Between the first and the second p$^+$-type high-concentration regions 261, 262 that are adjacent to one another, the p$^+$-type high-concentration connecting portions 263 extend in striped pattern along a second direction Y that is parallel to the front surface of the semiconductor substrate 210 and orthogonal to the first direction X.

The first and the second p$^+$-type high-concentration regions 261, 262 and the p$^+$-type high-concentration connecting portions 263 form a grid-like shape in a plan view thereof (FIG. 21). Lower surfaces (ends facing the n$^+$-type drain region 231) of the p$^+$-type high-concentration connecting portions 263 are positioned at a depth substantially equal to that of lower surfaces of the first and the second p$^+$-type high-concentration regions 261, 262. A thickness of the p$^+$-type high-concentration connecting portions 263 is substantially equal to a thickness of the first p$^+$-type high-concentration regions 261. A metal silicide film 241, a barrier metal 246, and an Al electrode film 247 are sequentially stacked on the front surface of the semiconductor substrate 210 and function as a source electrode.

A double-sided cooling structure is configured by a wiring structure on the Al electrode film 247 and cooling fins (not depicted) bonded to a drain electrode 252 at the back surface of the semiconductor substrate 210, via a metal base plate of an insulated substrate (not depicted). Reference characters 233, 240, and 240a are n-type current spreading regions, an interlayer insulating film, and contact holes, respectively. Reference numerals 242, 243, 244, and 245 are metal films configuring the barrier metal 246. Reference numerals 248 and 249 are, respectively, plating films and terminal pins configuring the wiring structure on the Al electrode film 247. Reference numerals 250 and 251 are protective films.

As a conventional vertical MOSFET having a trench gate structure, a device has been proposed in which p$^+$-type high-concentration regions that face trench bottoms and p$^+$-type high-concentration regions that are between adjacent trenches are disposed so as to form, at depth positions closer to an n$^+$-type drain region than are bottoms of the trenches, a grid-like shape in a plan view (for example, refer to International Publication No. WO 2017/064949). In International Publication No. WO 2017/064949, holes generated during avalanche breakdown by pn junctions between the p$^+$-type high-concentration regions and an n$^-$-type drift region may be efficiently migrated to a source electrode, thereby enhancing gate insulating film reliability.

As a conventional vertical MOSFET having a trench gate structure, a device has been proposed in which a p-type trench bottom protective layer surrounding trench bottoms has a 2-layered structure including a high-concentration protective layer facing the trench bottoms and a low-concentration protective layer forming at least a portion of a bottom of the trench bottom protective layer (for example, refer to Japanese Patent No. 6266166). In Japanese Patent No. 6266166, electric field applied to pn junctions between the trench bottom protective layer and a drift region is mitigated by the low-concentration protective layer, which has an impurity concentration that is relatively lower than that of the trench bottom protective layer, whereby avalanche breakdown capability is enhanced.

As a conventional vertical MOSFET having a trench gate structure, a device has been proposed that has, in an active region, p$^+$-type high-concentration regions that mitigate electric field applied to a gate insulating film at trench bottoms and that has a field limiting ring (FLR) in an edge termination region that surrounds a periphery of the active region (for example, refer to Japanese Laid-Open Patent Publication No. 2016-225455). Japanese Laid-Open Patent Publication No. 2016-225455 discloses that the p$^+$-type high-concentration regions that mitigate electric field applied to the gate insulating film at the trench bottoms and the FLR in the edge termination region are formed concurrently.

SUMMARY OF THE INVENTION

According to an embodiment of the invention, a semiconductor device includes: a semiconductor substrate containing a semiconductor having band gap that is wider than a band gap of silicon, the semiconductor substrate having a first main surface and a second main surface that are opposite to each other; a first semiconductor region of a first conductivity type, provided in the semiconductor substrate; a second semiconductor region of a second conductivity type, provided between the first main surface of the semiconductor substrate and the first semiconductor region; a plurality of third semiconductor regions of the first conductivity type, selectively provided between the first main surface of the semiconductor substrate and the second semiconductor region; a plurality of trenches penetrating through, in a depth direction of the semiconductor device, the third semiconductor regions and the second semiconductor region and reaching the first semiconductor region, the trenches being provided in a striped pattern extending in a first direction that is parallel to the first main surface of the semiconductor substrate; a plurality of gate electrodes provided in the trenches via a gate insulating film; a first electrode electrically connected to the second semiconductor region and the third semiconductor regions; a second electrode provided on the second main surface of the semiconductor substrate; a plurality of first low-concentration regions of the second conductivity type, selectively provided in the first semiconductor region, each of the first low-concentration regions facing a respective one of bottoms of the trenches; and a plurality of first connecting portions of the second conductivity type, each of the first connecting portions connecting an adjacent two of the first low-concentration regions in a second direction that is parallel to the first main surface of the semiconductor substrate and orthogonal to the first direction. The first low-concentration regions and the first connecting portions are electrically connected to the second semiconductor region. The first low-concentration regions extend linearly in the first direction, the first low-concentration regions forming a grid-like pattern with the first connecting portions in a plan view of the semiconductor device.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
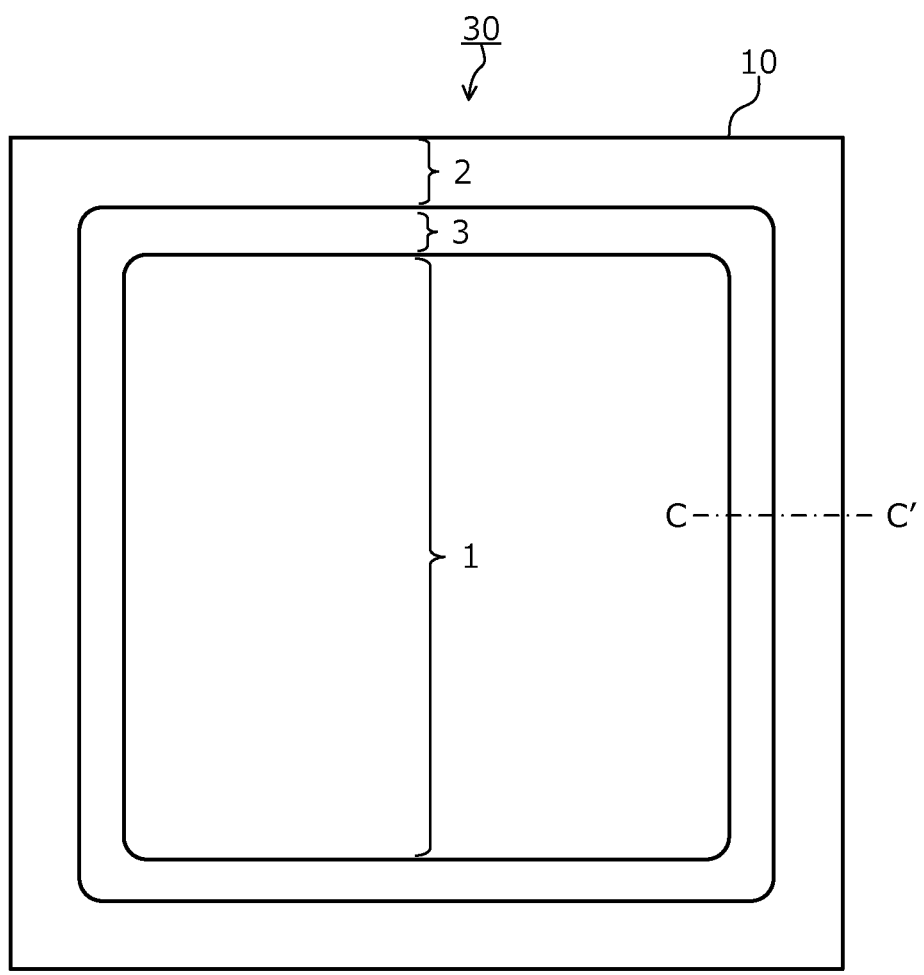
FIG. 1 is a plan view depicting a layout when a semiconductor device according to a first embodiment is viewed from a front side of a semiconductor substrate.

First, problems associated with the conventional techniques are discussed. In the conventional semiconductor device 230 (refer to FIGS. 17 to 21) described above, while electric field applied to the gate insulating film 238 at the bottoms of the trenches 237 is mitigated by the first and the second $p^+$-type high-concentration regions 261, 262, the smaller is the cell structure (trench gate structure) of the unit cell, the narrower is an interval between one of the first $p^+$-type high-concentration regions 261 and an adjacent one of the second $p^+$-type high-concentration regions 262. Therefore, a resistance value of junction FET (JFET) resistance increases and thus, on-resistance RonA increases, the JFET resistance being internal resistance of the semiconductor substrate 210, between the first and the second $p^+$-type high-concentration regions 261, 262 that are adjacent to one another.

Embodiments of a semiconductor device according to the present invention is described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and will not be repeatedly described.

Figure 6:
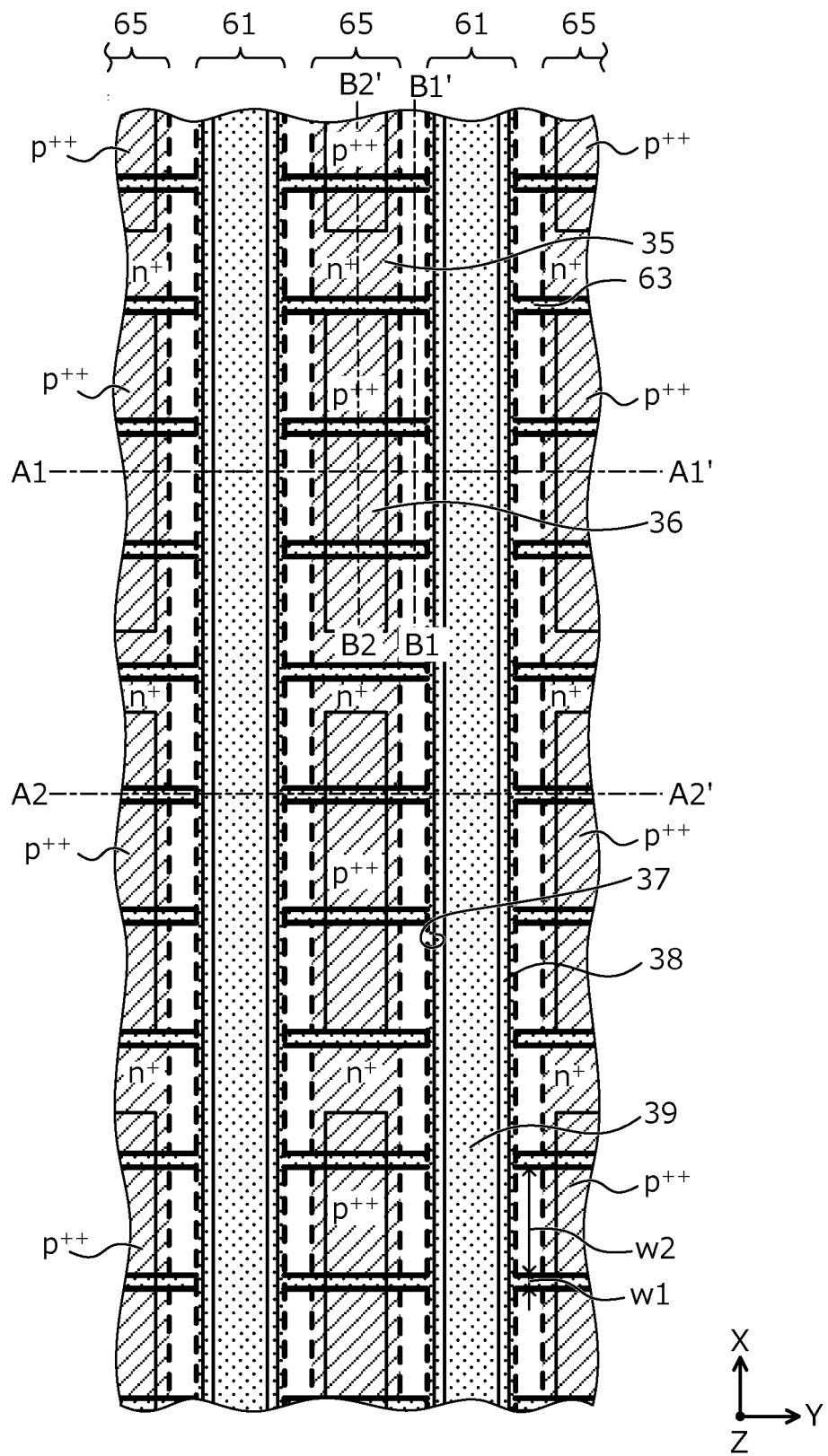
FIG. 6 is an enlarged plan view of a portion of an active region in FIG. 1.

A structure of a semiconductor device according to a first embodiment is described. FIG. 1 is a plan view depicting a layout when the semiconductor device according to the first embodiment is viewed from a front side of a semiconductor substrate. FIGS. 2, 3, 4, and 5 are cross-sectional views of the structure along cutting line A1-A1', cutting line A2-A2', cutting line B1-B1', and cutting line B2-B2' in FIG. 6, respectively. FIG. 6 is an enlarged plan view of a portion of an active region in FIG. 1. FIG. 6 depicts a layout of p-type low-concentration regions (first low-concentration regions) 61, p-type low-concentration regions 65, and p-type low-concentration connecting portions 63 near bottoms of trenches 37.

A semiconductor device 30 according to the first embodiment depicted in FIGS. 1 to 6 is a vertical MOSFET that has a semiconductor substrate (semiconductor chip) 10 containing silicon carbide (SiC) in which a trench gate structure (device element structure) is provided in an active region 1. The active region 1 is a region through which a main current (drift current) flows when the MOSFET (the semiconductor device 30) is on. In the active region 1, multiple unit cells (constituent units of the device element) of the MOSFET, each having the same structure, are disposed adjacently to one another. The active region 1, for example, has a substantially rectangular shape in a plan view and is disposed in substantially a center (chip center) of the semiconductor substrate 10.

The active region 1 is a region further on a chip inner side (chip center side) than is a chip-end sidewall (side surface of the interlayer insulating film 40) of an outermost contact hole 40b (refer to later-described FIG. 14), the chip-end sidewall being closest to the chip end among the sidewalls of the contact hole 40b. An intermediate region 3 between the active region 1 and an edge termination region 2 is adjacent to the active region 1 and surrounds a periphery of the active region 1. A border between the intermediate region 3 and the edge termination region 2 is a border between later-described first and third surface portions 10a, 10c of a front surface of the semiconductor substrate 10 (refer to FIG. 14). The edge termination region 2 is a region between the active region 1 and an end (chip end) of the semiconductor substrate 10.

The edge termination region 2 surrounds the periphery of the active region 1 with the intermediate region 3 intervening therebetween and has a function of mitigating electric field of a front side of the semiconductor substrate 10 and sustaining a withstand voltage. In the edge termination region 2, a voltage withstanding structure such as a field limiting ring (FLR) structure, a junction termination extension (JTE) structure, etc. is disposed. The withstand voltage is a voltage limit at which voltage between a source and drain does not further increase even when current between the source and drain increases during avalanche breakdown by main junctions (pn junctions) of the active region 1.

In the active region 1, the trench gate structure is provided at the front side of the semiconductor substrate 10. The trench gate structure is configured by a p-type base region (second semiconductor region) 34, $n^+$-type source regions (third semiconductor regions) 35, $p^{++}$-type contact regions 36, the trenches 37, a gate insulating film 38, and gate electrodes 39. A portion (later-described outer peripheral p-type base region 34a, refer to FIG. 14) closer to the chip end than are outermost trenches 37 that, of the trenches 37, are closest to the chip end is free of the $n^+$-type source regions 35. Multiple trench gate structures of the unit cells (functional units of the device element) of the semiconductor device 30 are disposed adjacently to one another.

The semiconductor substrate 10 is formed by sequentially forming epitaxial layers 12, 13 on a front surface of an $n^+$-type starting substrate 11 that contains silicon carbide, the epitaxial layers 12, 13 being formed by epitaxial growth and constituting an $n^-$-type drift region (first semiconductor region) 32 and the p-type base region 34, respectively. The semiconductor substrate 10 has, as the front surface, a main surface that is a surface of the p-type epitaxial layer 13 and as a back surface, a main surface that is a surface of the $n^+$-type starting substrate 11. The $n^+$-type starting substrate 11 constitutes an $n^+$-type drain region 31. The $n^-$-type drift region 32 is provided between the p-type base region 34 and the $n^+$-type drain region 31.

The $n^-$-type drift region 32 is a portion of the $n^-$-type epitaxial layer 12 excluding later-described n-type current spreading regions 33, the p-type low-concentration regions (low-concentration regions) 61, the p-type low-concentration regions 65, the p-type low-concentration connecting portions (first connecting portions) 63, and $p^+$-type high-concentration regions (first and second high-concentration regions) 62, 64 of the active region 1, and a later-described outer peripheral $p^+$-type region 62a, an outer peripheral p-type low-concentration region 65a, FLRs 23, and an $n^+$-type channel stopper region 24 of the edge termination region 2 and the intermediate region 3 (refer to FIG. 14). The $n^-$-type drift region 32 spans the active region 1 to the chip end and is exposed at the end (side surface of the semiconductor substrate 10) of the semiconductor substrate 10 (refer to FIG. 14).

The trenches 37 penetrate through the p-type epitaxial layer 13 in the depth direction Z from the front surface of the semiconductor substrate 10 and reach an interior of the $n^-$-type epitaxial layer 12. The trenches 37 of the unit cells, for example, extend in a striped pattern along the first direction X that is parallel to the front surface of the semiconductor substrate 10, and reach the intermediate region 3. In the trenches 37, the gate electrodes 39 are provided on the gate insulating film 38. The p-type base region 34, the $n^+$-type source regions 35, and the $p^{++}$-type contact regions 36 are each selectively provided between the trenches 37, which are adjacent to one another.

The p-type base region 34 is a portion of the p-type epitaxial layer 13 excluding the $n^+$-type source regions 35 and the $p^{++}$-type contact regions 36. The p-type base region 34 is in contact with the gate insulating film 38 at sidewalls of the trenches 37. Portions of the p-type base region 34 extend in a linear shape along a longitudinal direction (the first direction X) of the trenches 37. Between the front surface of the semiconductor substrate 10 and the p-type base region 34, the $n^+$-type source regions 35 and the $p^{++}$-type contact regions 36 are selectively provided in contact with the p-type base region 34 and are exposed at the front surface of the semiconductor substrate 10.

Being exposed at the front surface of the semiconductor substrate 10 means that the $n^+$-type source regions 35 and the $p^{++}$-type contact regions 36 are in contact with later-described NiSi films 41 by later-described contact holes 40a. The $n^+$-type source regions 35 are in contact with the gate insulating film 38 at the sidewalls of the trenches 37. Each of the $n^+$-type source regions 35 has portions that are along the sidewalls of the trenches 37, extending along the first direction X and portions that are each between a respective adjacent two of the $p^{++}$-type contact regions 36 that are adjacent to one another in the first direction X, the $n^+$-type source regions 35 forming, in a plan view thereof, a grid-like shape surrounding peripheries of the $p^{++}$-type contact regions 36.

The $p^{++}$-type contact regions 36 are disposed farther from the trenches 37 than are the $n^+$-type source regions 35. The $p^{++}$-type contact regions 36 are disposed so as to penetrate through the p-type base region 34 and be in contact with a lower surface (end facing the n⁺-type drain region 31) of the p-type base region 34. Lower surfaces of the p⁺⁺-type contact regions 36 need not be in contact with the lower surface of the p-type base region 34. The p⁺⁺-type contact regions 36 are scattered along the first direction X. The p⁺⁺-type contact regions 36 may be omitted. In this instance, instead of the p⁺⁺-type contact regions 36, the p-type base region 34 reaches and is exposed at the front surface of the semiconductor substrate 10. Between the p-type base region 34 and the n⁺-type drain region 31 (the n⁺-type starting substrate 11), the n⁻-type drift region 32 is provided in contact with the n⁺-type drain region 31.

The n-type current spreading regions 33, the p-type low-concentration regions 61, the p-type low-concentration regions 65, the p-type low-concentration connecting portions 63, the p⁺-type high-concentration regions 62, and the p⁺-type high-concentration regions 64 are provided between the p-type base region 34 and the n⁻-type drift region 32, at depth positions closer to the n⁺-type drain region 31 than are the bottoms of the trenches 37. The n-type current spreading regions 33 constitute a so-called current spreading layer (CSL) that reduces carrier spreading resistance. Upper surfaces (ends facing the n⁺-type source regions 35) of the n-type current spreading regions 33 are in contact with the p-type base region 34.

The n-type current spreading regions 33, in a direction parallel to the front surface of the semiconductor substrate 10, are in contact with the p-type low-concentration regions 61, the p-type low-concentration regions 65, the p-type low-concentration connecting portions 63, the p⁺-type high-concentration regions 62, and the p⁺-type high-concentration regions 64 as well as the gate insulating film 38 at the sidewalls of the trenches 37. JFET resistance of the n-type current spreading regions 33 is formed between the p-type low-concentration regions 61 and the p-type low-concentration regions 65 and between the p⁺-type high-concentration regions 62 and the p⁺-type high-concentration regions 64. The n-type current spreading regions 33 may be omitted. In this instance, instead of the n-type current spreading regions 33, the n⁻-type drift region 32 reaches the p-type base region 34 and is in contact with the p-type base region 34.

The p-type low-concentration regions 61, the p-type low-concentration regions 65, the p-type low-concentration connecting portions 63, the p⁺-type high-concentration regions 62, and the p⁺-type high-concentration regions 64 have a function of mitigating electric field applied to the gate insulating film 38 at the bottoms of the trenches 37. The p-type low-concentration regions 65, the p-type low-concentration connecting portions 63, and the p⁺-type high-concentration regions 62 have a function of mitigating electric field applied to the gate insulating film 38 at the sidewalls of the trenches 37. The p-type low-concentration regions 61 (in FIG. 6, portions outlined by thick broken lines and filled with dotted hatching) and the p⁺-type high-concentration regions 64 extend along the first direction X and, in an outer periphery of the active region 1, is continuous with the outer peripheral p⁺-type region 62a and the outer peripheral p-type low-concentration region 65a. The p-type low-concentration regions 65 (in FIG. 6, portions outlined by thick broken lines and filled with solid-lined hatching) and the p⁺-type high-concentration regions 62 extend along the first direction X and, in the outer periphery of the active region 1, are continuous with the outer peripheral p⁺-type region 62a and the outer peripheral p-type low-concentration region 65a. The p-type low-concentration connecting portions 63 (in FIG. 6, portions indicated by solid lines and dotted hatching) are scattered along the first direction X.

The p-type low-concentration regions 61 and the p-type low-concentration regions 65 suffice to be at about the same depth, closer to the n⁺-type drain region 31 than are the bottoms of the trenches 37. About the same depth means the depths are the same within a range that includes an allowed error due to process variation. For example, the p-type low-concentration regions 61 and the p-type low-concentration regions 65 may reach positions at about the same depth as that of the n-type current spreading regions 33 or may reach positions that are closer to the n⁺-type drain region 31 than are the n-type current spreading regions 33 to be in contact with the n⁻-type drift region 32 (refer to FIGS. 2 to 5), or may terminate in the n-type current spreading regions 33, whereby peripheries of the p-type low-concentration regions 61 and the p-type low-concentration regions 65 are surrounded by the n-type current spreading regions 33 (not depicted).

The p-type low-concentration regions 61 are provided separate from the p-type base region 34 and face the bottoms of the trenches 37 in the depth direction Z. A depth (distance) d1 from the bottoms of the trenches 37 to lower surfaces (ends facing the n⁺-type drain region 31) of the p-type low-concentration regions 61, for example, is in a range of about 0.7 μm to 1.1 μm, which is deeper than a distance (depth) d201 (=4 μm to 5 μm) from the bottoms of the trenches 237 to lower surfaces of the first p⁺-type high-concentration regions 261 of the conventional structure (refer to FIGS. 17 to 21). The p-type low-concentration regions 61 have an impurity concentration in a range of, for example, about $3\times10^{17}/cm^3$ to $9\times10^{17}/cm^3$, which is lower than an impurity concentration of the first p⁺-type high-concentration regions 261 that face the bottoms of the trenches 237 of the conventional structure.

Therefore, compared to the first p⁺-type high-concentration regions 261 of the conventional structure, the p-type low-concentration regions 61 are formed by ion implantation with a low dose amount, whereby impurity diffusion is difficult. Thus, a width (width along the second direction Y) of the p-type low-concentration regions 61 may be made narrower than a width of the first p⁺-type high-concentration regions 261 of the conventional structure. As a result, compared to the conventional structure, the cell pitch (distance between any adjacent two of the trenches 37) may be reduced and the number of cells that can be disposed in the active region 1 may be increased. The width of each of the p-type low-concentration regions 61, for example, is wider than a width of each of the trenches 37.

Any adjacent two of the p-type low-concentration regions 61 are connected to each other at predetermined locations by the p-type low-concentration connecting portions 63 that have an impurity concentration that is substantially equal to that of the p-type low-concentration regions 61. Substantially equal impurity concentrations means that the impurity concentrations are about the same within a range that includes an allowed error due to process variation. Between the p-type low-concentration regions 61, which are adjacent to one another, the p-type low-concentration connecting portions 63 extend in a striped pattern along the second direction Y that is parallel to the front surface of the semiconductor substrate 10 and orthogonal to the first direction X. The p-type low-concentration regions 61 and the p-type low-concentration connecting portions 63 form a grid-like shape in a plan view thereof. In an instance in which the p-type low-concentration regions 65 are provided, the p-type low-concentration regions 61 and the p-type low-concentration regions 65 are connected to one another at predetermined locations by the p-type low-concentration connecting portions 63, whereby the p-type low-concentration regions 61, the p-type low-concentration regions 65, and the p-type low-concentration connecting portions 63 form a grid-like shape in a plan view thereof.

A width (width along the first direction X) w1 of each of the p-type low-concentration connecting portions 63 is in a range from a process limit (for example, about 0.5 µm) to 1.0 µm, which is narrower than a width w201 each of the p+-type high-concentration connecting portions 263 that connect the first and the second p+-type high-concentration regions 261, 262, which are adjacent to one another, in the conventional structure. An interval (pitch) w2 between any adjacent two of the p-type low-concentration connecting portions 63 in the first direction X, for example, is about 3 µm or less, which is narrower than an interval w202 (30 µm to 50 µm) between any adjacent two of the p+-type high-concentration connecting portions 263 in the first direction X, in the conventional structure.

A thickness of each of the p-type low-concentration connecting portions 63, for example, is about the same or less than a combined thickness of one of the p-type low-concentration regions 61 and one of the p+-type high-concentration regions 64. Upper surfaces of the p-type low-concentration connecting portions 63 may be at positions closer to the n+-type drain region 31 than are upper surfaces of the p+-type high-concentration regions 64 or may be a positions closer to the p-type base region 34 than are the bottoms of the trenches 37. For example, the upper surfaces of the p-type low-concentration connecting portions 63 may be at the same depth as that of upper surface of the p-type low-concentration regions 61. Preferably, lower surfaces of the p-type low-concentration connecting portions 63 may be positioned at about the same depth as that of the lower surfaces of the p-type low-concentration regions 61, nonetheless, the lower surfaces of the p-type low-concentration connecting portions 63 may be positioned at a depth closer to the n+-type source regions 35 than are the lower surfaces of the p-type low-concentration regions 61. Further, the lower surfaces of the p-type low-concentration connecting portions 63 may be positioned closer to the n+-type drain region 31 than are the lower surfaces of the p-type low-concentration regions 61.

Between adjacent trenches of the trenches 37, the p-type low-concentration regions 65 and the p+-type high-concentration regions 62 are provided separate from the p-type low-concentration regions 61, the p+-type high-concentration regions 64, and the trenches 37. The p+-type high-concentration regions 62 extend in the first direction X so that ends thereof facing the n+-type drain region 31 penetrate through the p-type low-concentration connecting portions 63 that are adjacent to one another in the first direction X. The ends of the p+-type high-concentration regions 62 facing the n+-type drain region 3 terminate in the p-type low-concentration connecting portions 63. The p-type low-concentration regions 65 are provided spanning between adjacent p-type low-concentration connecting portions of the p-type low-concentration connecting portions 63 in the first direction X, the p-type low-concentration regions 65 being in contact with the p-type low-concentration connecting portions 63 that are adjacent to one another in the first direction X. The p+-type high-concentration regions 62 are electrically connected to the p-type base region 34, whereby the p-type low-concentration regions 61, the p-type low-concentration regions 65, the p-type low-concentration connecting portions 63, and the p+-type high-concentration regions 64 are fixed to a potential of a source electrode.

Further, the p+-type high-concentration regions 62 extend in the first direction X in a linear shape of about the same length as that of the trenches 37 in the longitudinal direction of the trenches 37 and upper surfaces of the p+-type high-concentration regions 62 are in contact with the p++-type contact regions 36 or the p-type base region 34. About the same length means the lengths are the same within a range that includes an allowed error due to process variation. The p+-type high-concentration regions 62 are provided in a striped pattern. Each of the p+-type high-concentration regions 62 is formed by a first portion and a second portion that are connected in the depth direction Z, the first portion (corresponds to later-described p+-type regions 81, refer to FIG. 9) extending along the first direction X between the p-type base region 34 and the p-type low-concentration connecting portions 63 and the second portion (corresponds to later-described p+-type regions 83, refer to FIG. 9) extending along the first direction X so as to pass through an adjacent two of the p-type low-concentration connecting portions 63 in the first direction X. Further, the p-type low-concentration regions 65 are provided so as to have upper surfaces thereof to be in contact with the p+-type high-concentration regions 62. Lower surfaces of the p-type low-concentration regions 65 are at the same height as that of the lower surfaces of the p-type low-concentration regions 61 and/or the lower surfaces of the p-type low-concentration connecting portions 63. The p-type low-concentration regions 65 have an impurity concentration that is, for example, in a range of about $3\times10^{17}/cm^3$ to $9\times10^{17}/cm^3$.

The p+-type high-concentration regions 62, in a direction to the n+-type drain region 31, reach about the same depth as that of the p+-type high-concentration regions 64. The p+-type high-concentration regions 62 have an impurity concentration that is higher than impurity concentrations of the p-type low-concentration regions 61 and the p-type base region 34. The impurity concentration of the p+-type high-concentration regions 62 may be substantially equal to the impurity concentration of the p+-type high-concentration regions 64. A width (width in the second direction Y) of each of the p+-type high-concentration regions 62 may be wider than the width of each of the p-type low-concentration regions 61 (for example, about the same width as that of the second p+-type high-concentration regions 262 of the conventional structure) or may be less than or equal to the width of each of the p-type low-concentration regions 61.

Each of the p+-type high-concentration regions 64 is provided between a respective one of the p-type low-concentration regions 61 and the bottom and bottom corner portions of a respective one of the trenches 37, and is in contact with the respective one of the p-type low-concentration regions 61. The bottom corner portions are borders between the bottom and the sidewalls of each of the trenches 37. The p+-type high-concentration regions 64, which have an impurity concentration that is higher than the impurity concentration of the p-type low-concentration regions 61, are disposed between the p-type low-concentration regions 61 and the bottoms of the trenches 37, whereby electric field applied to the gate insulating film 38 at the bottoms of the trenches 37 when the MOSFET is off may be mitigated even when the impurity concentration of the p-type low-concentration regions 61 is low.

The impurity concentration of the p+-type high-concentration regions 64 is higher than the impurity concentrations of the p-type low-concentration regions 61 and the p-type base region 34 and is, for example, at least about 2 times the impurity concentration of the p-type low-concentration regions 61. While the p+-type high-concentration regions 64 extend along the first direction X so that the side facing the n+-type drain region 31 penetrates through the p-type low-concentration connecting portions 63 that are adjacent to one another in the first direction X, the p+-type high-concentration regions 64 may be provided so to be in contact with the upper surfaces of the p-type low-concentration connecting portions 63. The p+-type high-concentration regions 64 face the bottoms and the bottom corner portions of the trenches 37 and a width (width in the second direction Y) of each of the p+-type high-concentration regions 64 is wider than the width of each of the trenches 37. The width of each of the p+-type high-concentration regions 64 may be, for example, about the same width as that of each of the p-type low-concentration regions 61. About the same width means the widths are the same within a range that includes an allowed error due process variation.

Figure 2:
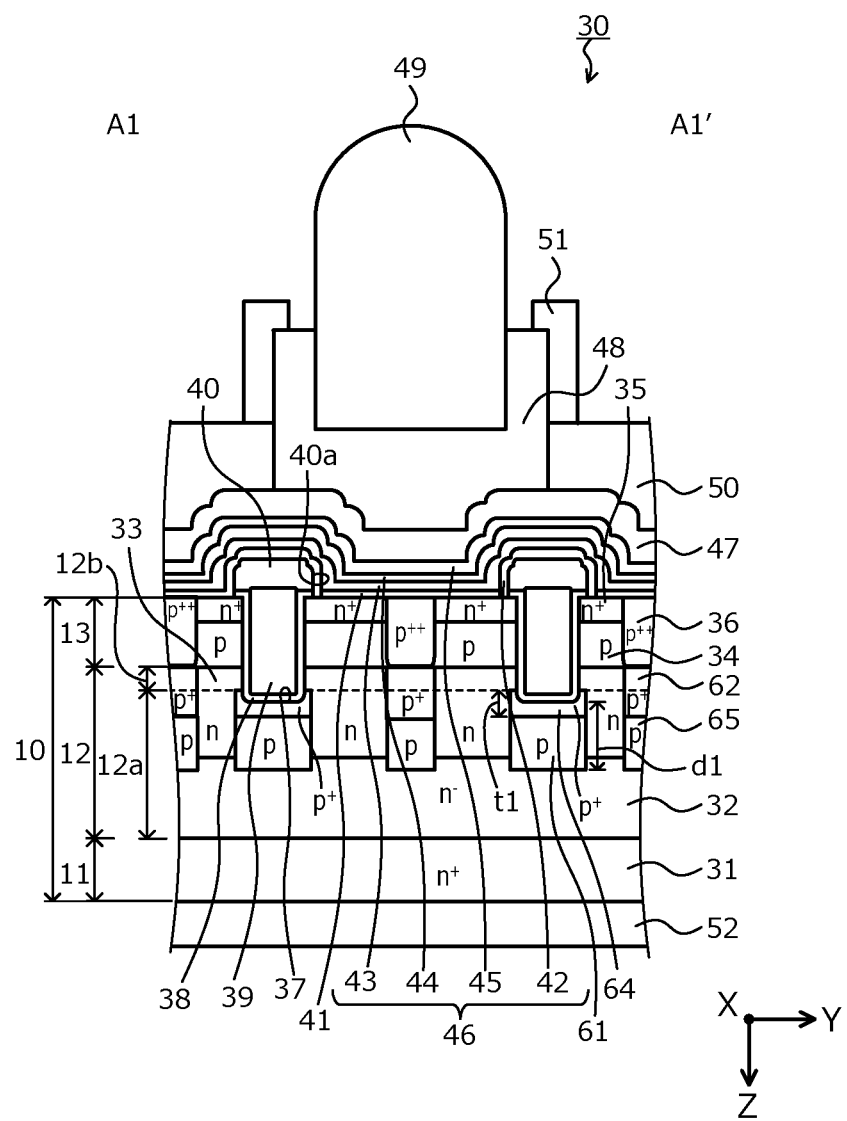
FIG. 2 is a cross-sectional view of the structure along cutting line A1-A1' in FIG. 6.

The p+-type high-concentration regions 64 may be in contact with the gate insulating film 38 at the bottoms of the trenches 37 (or at the bottom and the bottom corner portions) (FIG. 2). The p+-type high-concentration regions 64 have a sufficient thickness t1 (for example, about 0.4 μm) such that the trenches 37 do not penetrate through the p+-type high-concentration regions 64 in the depth direction Z as a result of depth variations due to etching for forming the trenches 37. A distance from the bottoms of the trenches 37 to lower surfaces of the p+-type high-concentration regions 64, for example, is in a range of about 0.1 μm to 0.15 μm as a result of the depth variations due to the etching for the trenches 37.

An interlayer insulating film 40 is provided in substantially an entire area of the front surface of the semiconductor substrate 10 and covers all the gate electrodes 39. In the contact holes 40a that penetrate through the interlayer insulating film 40 in the depth direction Z, the n+-type source regions 35 and the p++-type contact regions 36 are exposed. Nickel silicide (NixSiy, where, x and y are integers, hereinafter, collectively "NiSi") films 41 are in ohmic contact with the semiconductor substrate 10 in the contact holes 40a of the interlayer insulating film 40 and are electrically connected to the n+-type source regions 35 and the p++-type contact regions 36.

In an instance in which the p++-type contact regions 36 are omitted, instead of the p++-type contact regions 36, the p-type base region 34 is exposed in the contact holes 40a of the interlayer insulating film 40 and electrically connected to the NiSi films 41. A barrier metal 46 is provided along surfaces of the NiSi films 41 and the interlayer insulating film 40, on an entire area of the surfaces of the NiSi films 41 and the interlayer insulating film 40 in the active region 1. The barrier metal 46 has a function of preventing mutual reactions between metal films of the barrier metal 46 or between regions that face each other with the barrier metal 46 intervening therebetween.

The barrier metal 46, for example, may have a layered structure in which a first titanium nitride (TiN) film 42, a first titanium (Ti) film 43, a second TiN film 44, and a second Ti film 45 are sequentially stacked. The first TiN film 42 covers an entire area of the surface of the interlayer insulating film 40 in the active region 1. The first Ti film 43 is provided on an entire area of the surfaces of the first TiN film 42 and the NiSi films 41. The second TiN film 44 is provided on an entire area of the surface of the first Ti film 43. The second Ti film 45 is provided on an entire area of the surface of the second TiN film 44.

An aluminum (Al) electrode film 47 is provided on an entire area of the surface of the second Ti film 45. The Al electrode film 47 is electrically connected to the n+-type source regions 35 and the p++-type contact regions 36 via the barrier metal 46 and the NiSi films 41. The Al electrode film 47 may be an Al film, an aluminum-silicon (Al—Si) film, or an aluminum-silicon-copper (Al—Si—Cu) film having a thickness of, for example, about 5 μm. The Al electrode film 47, the barrier metal 46, and the NiSi films 41 function as the source electrode (first electrode).

On the Al electrode film 47, first ends of terminal pins 49 are bonded via plating films 48 and a soldering layer (not depicted). Second ends of the terminal pins 49 are bonded to a metal bar (not depicted) disposed facing the front surface of the semiconductor substrate 10. Further, the second ends of the terminal pins 49 are exposed outside a case (not depicted) in which the semiconductor substrate 10 is mounted, the second ends of the terminal pins 49 being electrically connected to an external device (not depicted). The terminal pins 49 are soldered to the plating films 48 in a substantially upright state orthogonal to the front surface of the semiconductor substrate 10.

The terminal pins 49 are round rod-shaped (cylindrical) wiring members having a predetermined diameter corresponding to the current capability of the MOSFET and are connected to an external ground potential (minimum potential). The terminal pins 49 are connection terminals that lead out potential of the Al electrode film 47 to an external destination. First and second protective films 50, 51, for example, are organic high-polymer material films with high heat resistance such as a polyimide. The first protective film 50 covers portions of the surface of the Al electrode film 47 other than those portions covered by the plating films 48. The first protective film 50 is a passivation film for protecting the front surface of the semiconductor substrate 10.

A portion of the Al electrode film 47 exposed in an opening of the first protective film 50 constitutes a source pad. The second protective films 51 cover borders between the plating films 48 and the first protective film 50. A drain electrode (second electrode) 52 is in ohmic contact with an entire area of the back surface (back surface of the n+-type starting substrate 11) of the semiconductor substrate 10 and is electrically connected to the n+-type drain region 31 (the n+-type starting substrate 11). On the drain electrode 52, for example, a drain pad (electrode pad, not depicted) is provided having a layered structure in which a Ti film, a nickel (Ni) film, and a gold (Au) film are sequentially stacked.

The terminal pins 49 are bonded to the Al electrode film 47 at the front surface of the semiconductor substrate 10 while the drain pad of the back surface is bonded to a metal base plate of an insulated substrate, whereby the semiconductor substrate 10 has a double-sided cooling structure that includes a cooling structure at each main surface. Heat generated by the semiconductor substrate 10 is dissipated from fin portions of a cooling fin, via the metal base plate bonded to the drain pad of the back surface of the semiconductor substrate 10 and the heat is dissipated from the metal bar to which the terminal pins 49 of the front surface of the semiconductor substrate 10 are bonded.

Operation of the semiconductor device 30 according to the first embodiment is described. When voltage at least equal to a gate threshold voltage is applied to the gate electrodes 39 while voltage (forward voltage) that is positive with respect to the source electrode (the Al electrode film 47) is applied to the drain electrode 52, channels (n-type inversion layer) are formed in portions of the p-type base region 34 along the trenches 37. As a result, current (drift current)

passes through the channels from the n⁺-type drain region 31 and flows to the n⁺-type source regions 35, whereby the MOSFET turns on.

The impurity concentration of the p-type low-concentration regions 61 that face the bottoms of the trenches 37 is lower than the impurity concentration (for example, about $5.0×10^{18}/cm^3$) of the first p⁺-type high-concentration regions 261 that face the bottoms of the trenches 237 of the conventional structure (refer to FIGS. 17 to 21). In each of the p-type low-concentration regions 61 formed by ion implantation with a low dose amount, spreading in the second direction Y is 0.15 µm narrower on each side compared to that in each of the first p⁺-type high-concentration regions 261 of the conventional structure. Therefore, the width of each of the p-type low-concentration regions 61 is a total of 0.3 µm narrower than the width of each of the first p⁺-type high-concentration regions 261 of the conventional structure.

Portions between the p-type low-concentration regions 61 and the p-type low-concentration regions 65, respectively adjacent thereto, where the p-type low-concentration connecting portions 63 are formed, do not constitute a path for the current that passes through the channels from the n⁺-type drain region 31 and flows to the n⁺-type source regions 35 when the MOSFET is on. The width of the p-type low-concentration regions 61 is narrow, whereby an interval between the p-type low-concentration regions 61 and the p-type low-concentration regions 65 respectively adjacent thereto increases, thereby enabling reduction of the resistance value of the JFET resistance, which is internal resistance formed therebetween, and reduction of the on-resistance.

Alternatively, in an instance in which the interval between the p-type low-concentration regions 61 and the p-type low-concentration regions 65 respectively adjacent thereto is maintained, the unit cells may be reduced in size by the extent to which the width of each of the p-type low-concentration regions 61 is reduced, and the unit cell density of the active region 1 may be increased while the area (surface area) of the active region 1 is maintained. Thus, the unit cell density of the active region 1 is increased and the on-resistance may be reduced, while the resistance value of the JFET resistance formed between the p-type low-concentration regions 61 and the p-type low-concentration regions 65 respectively adjacent thereto is maintained.

On the other hand, when voltage that is less than the gate threshold voltage is applied to the gate electrodes 39 while forward voltage is applied between the source and drain, pn junctions (main junctions) between the p-type low-concentration regions 61, the p-type low-concentration regions 65, the p-type low-concentration connecting portions 63, the p⁺-type high-concentration regions 62, the p⁺-type high-concentration regions 64, the p-type base region 34, the n-type current spreading regions 33, and the n⁻-type drift region 32 are reverse biased, whereby the current stops flowing and the MOSFET maintains an off state. Further, a depletion layer spreads in the p-type low-concentration regions 61, the p-type low-concentration regions 65, the p-type low-concentration connecting portions 63, and the p⁺-type high-concentration regions 62, from the pn junctions.

Spreading of the depletion layer is difficult in the p⁺-type high-concentration regions 64 between the bottoms of the trenches 37 and the p-type low-concentration regions 61. Therefore, even when the impurity concentration of the p-type low-concentration regions 61 is low, electric field applied to the gate insulating film 38 at the bottoms of the trenches 37 may be mitigated. Further, the interval w2 between the p-type low-concentration connecting portions 63 that connect adjacent p-type low-concentration regions of the p-type low-concentration regions 61 to each other is set to be narrow, for example, about 3 µm or less, whereby within a narrow range of about 3 µm or less in the first direction X, the total p-type impurity amount per a predetermined area near the bottoms of the trenches 37 is high and depletion of the p-type low-concentration regions 61 becomes difficult, thereby enabling further mitigation of the electric field applied to the gate insulating film 38 at the bottoms of the trenches 37.

Further, when the MOSFET is off and voltage that is negative with respect to the source electrode is applied to the drain electrode 52, current may be passed, in a forward direction, through parasitic diodes formed by pn junctions between the p-type low-concentration regions 61, the p-type low-concentration regions 65, the p-type low-concentration connecting portions 63, the p⁺-type high-concentration regions 62, the p⁺-type high-concentration regions 64, the p-type base region 34, the n-type current spreading regions 33, and the n⁻-type drift region 32. For example, in an instance in which the MOSFET is a device for an inverter, these parasitic diodes built into the semiconductor substrate 10 may be used as freewheeling diodes for protecting the MOSFET itself.

Next, a method of manufacturing the semiconductor device 30 according to the first embodiment is described. FIGS. 7, 8, 9, 10, 11, and 12 are cross-sectional views depicting states of the semiconductor device according to the first embodiment during manufacture. FIGS. 7 to 12 depict states of the structure (cross-sections of the structure corresponding to FIG. 2) along cutting line A1-A1' in FIG. 6, during manufacture. While states of the structure along cutting line A2-A2', cutting line B1-B1', and cutting line B2-B2' in FIG. 6 are not depicted, FIGS. 3 to 5, which correspond to these cutting lines, respectively, may be referred to.

Figure 7:
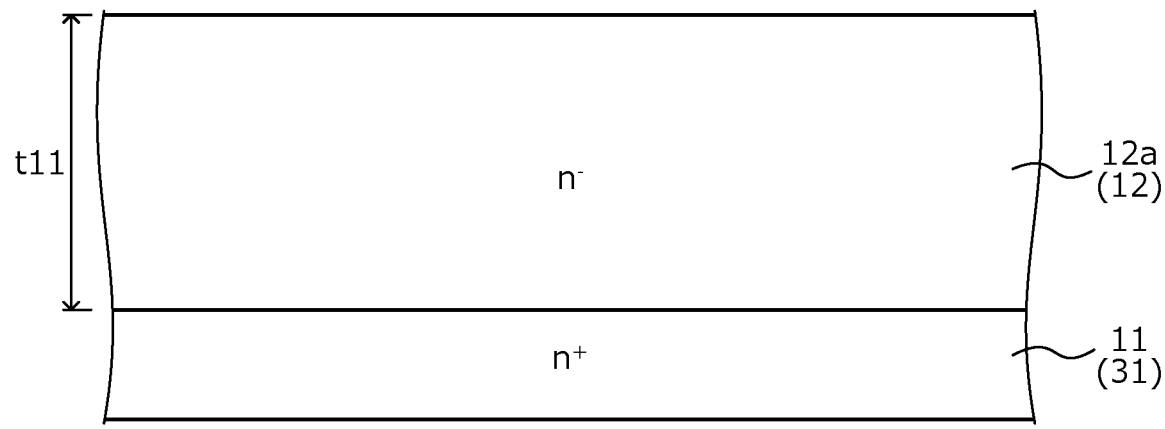
FIG. 7 is a cross-sectional view depicting a state of the semiconductor device according to the first embodiment during manufacture.

First, as depicted in FIG. 7, the n⁺-type starting substrate (starting wafer) 11 that contains silicon carbide is prepared. Next, on the front surface of the n⁺-type starting substrate 11, an n⁻-type epitaxial layer 12a (12) is epitaxially grown and doped with an n-type impurity such as nitrogen (N) to have an impurity concentration that is lower than the impurity concentration of the n⁺-type starting substrate 11. A thickness t11 of the n⁻-type epitaxial layer 12a is, for example, about 30 µm in an instance of a withstand voltage of 3300V and is, for example, about 10 µm in an instance of a withstand voltage of 1200V.

Figure 3:
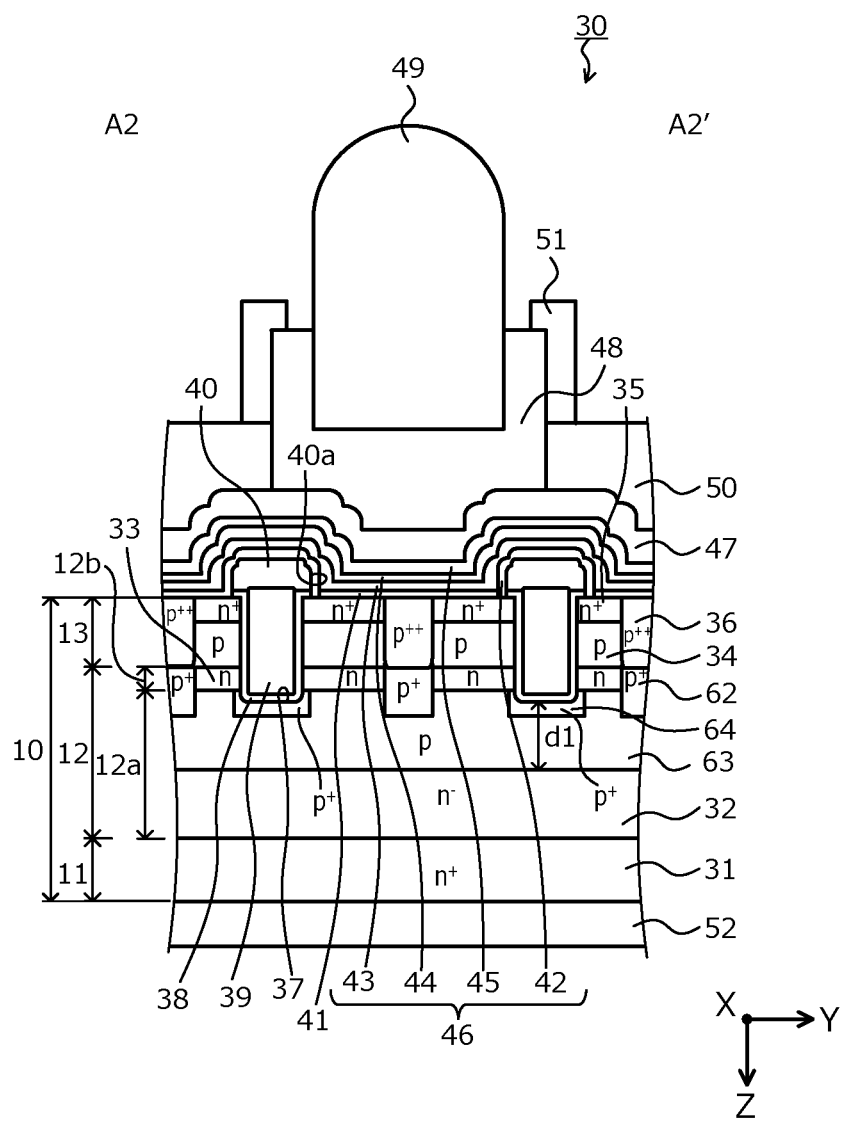
FIG. 3 is a cross-sectional view of the structure along cutting line A2-A2' in FIG. 6.
Figure 4:
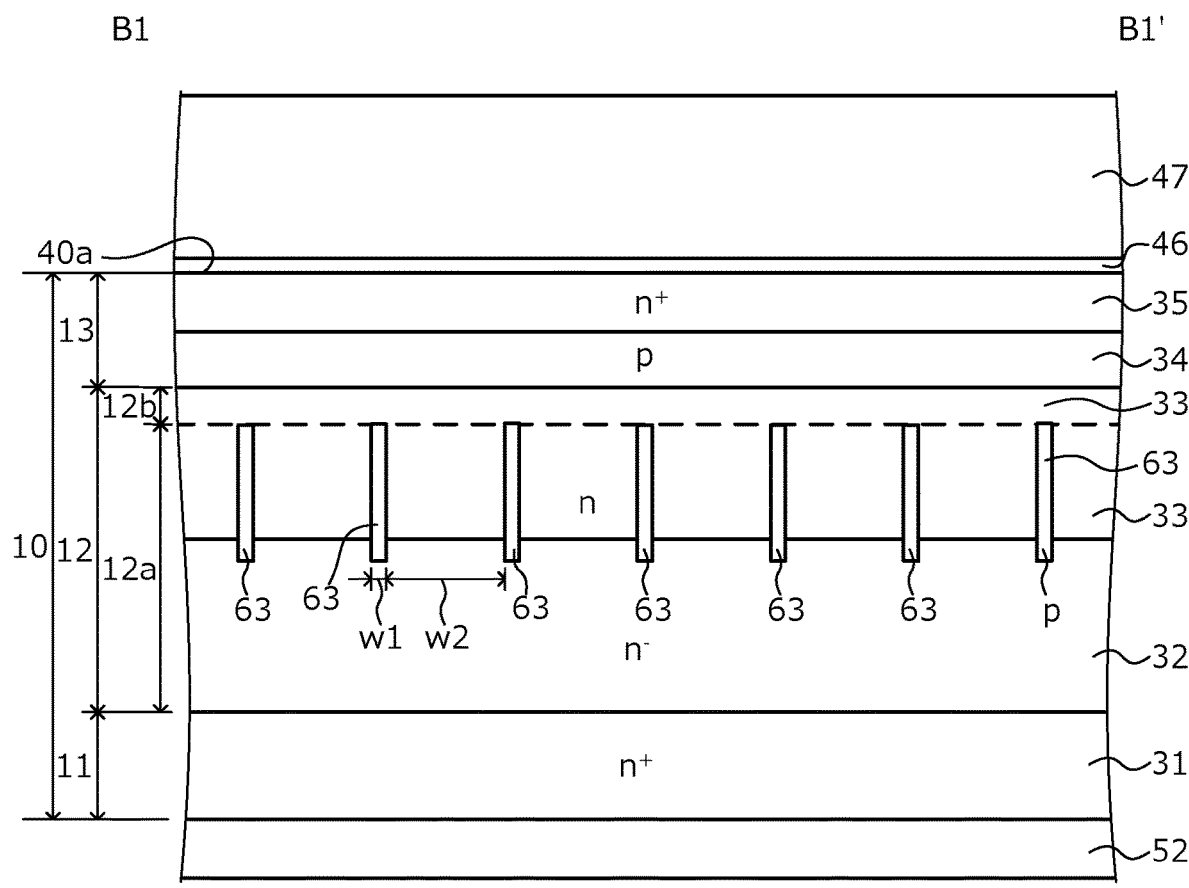
FIG. 4 is a cross-sectional view of the structure along cutting line B1-B1' in FIG. 6.
Figure 5:
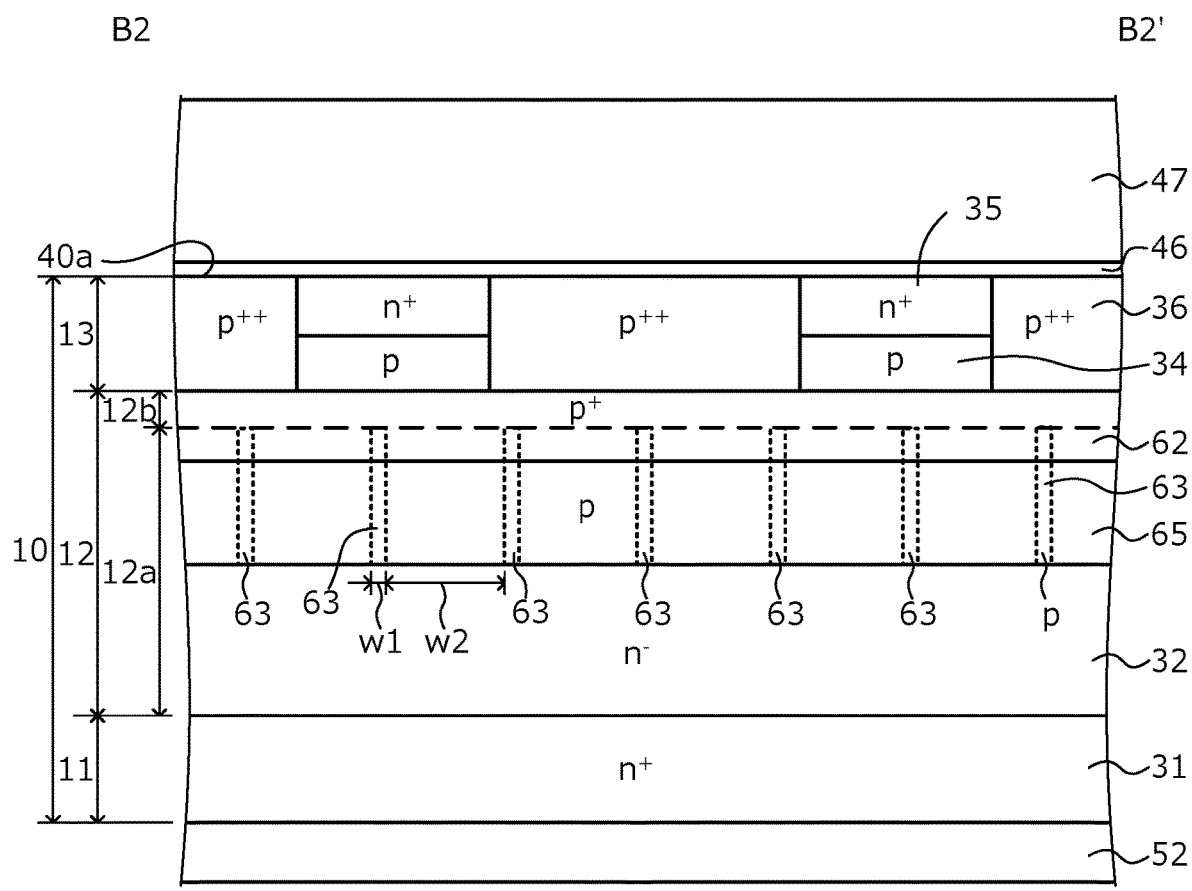
FIG. 5 is a cross-sectional view of the structure along cutting line B2-B2' in FIG. 6.
Figure 8:
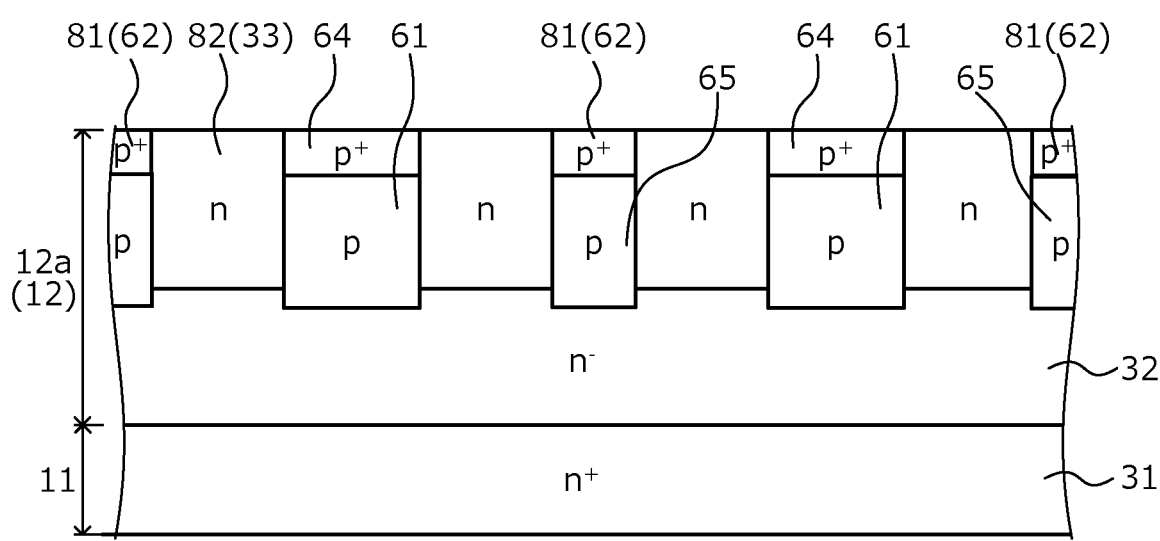
FIG. 8 is a cross-sectional view depicting a state of the semiconductor device according to the first embodiment during manufacture.

Next, as depicted in FIG. 8, by photolithography and, for example, ion implantation of a p-type impurity such as Al, in the active region 1, the p-type low-concentration regions 61, the p-type low-concentration regions 65, and the p-type low-concentration connecting portions 63 are selectively formed in surface regions of the n⁻-type epitaxial layer 12a (refer to FIG. 3). Next, the p⁺-type regions 81 that constitute portions of the p⁺-type high-concentration regions 62 are selectively formed in surface regions of the n⁻-type epitaxial layer 12a in the active region 1 by photolithography and, for example, ion implantation of a p-type impurity such as Al.

Next, the p⁺-type high-concentration regions 64 are formed in surface regions of the p-type low-concentration regions 61 by photolithography and, for example, ion implantation of a p-type impurity such as Al. Next, n-type regions 82 that constitute portions of the n-type current spreading regions 33 are formed in surface regions of the n⁻-type epitaxial layer 12a by photolithography and for example, ion implantation of an n-type impurity such as nitrogen. A portion of the n⁻-type epitaxial layer 12 excluding the p-type low-concentration regions 61, the p-type low-concentration regions 65, the p-type low-concentration connecting portions 63, the p⁺-type high-concentration regions 64, the p⁺-type regions 81, and the n-type regions 82 constitutes the n⁻-type drift region 32.

The sequence in which the p-type low-concentration regions 61, the p-type low-concentration regions 65, the p-type low-concentration connecting portions 63, the p⁺-type high-concentration regions 64, the p⁺-type regions 81, and the n-type regions 82 are formed may be interchanged. For example, the p⁺-type high-concentration regions 64 and the p⁺-type regions 81 may be formed concurrently and thereafter, in the ion implantation mask used to form the p⁺-type high-concentration regions 64 and the p⁺-type regions 81, openings are formed by removing portions that correspond to formation regions of the p-type low-concentration connecting portions 63. The p-type low-concentration regions 61, the p-type low-concentration regions 65, and the p-type low-concentration connecting portions 63 are formed using this ion implantation mask, whereby the p⁺-type high-concentration regions 64 and the p-type low-concentration regions 61 may be formed at the same positions by self-alignment while the p⁺-type regions 81 and the p-type low-concentration regions 65 are formed at the same positions by self-alignment.

By the processes up to here, the p-type low-concentration regions 61 and the p-type low-concentration regions 65 are disposed to repeatedly alternate one another in the second direction Y and the p-type low-concentration regions 61 are connected with the p-type low-concentration regions 65 adjacent thereto by the p-type low-concentration connecting portions 63. The p⁺-type high-concentration regions 64 each having the same width as that of each of the p-type low-concentration regions 61 are formed in surface regions of the p-type low-concentration regions 61. The p⁺-type regions 81 each having the same width as that of each of the p-type low-concentration regions 65 are formed in surface regions of the p-type low-concentration regions 65. The p-type low-concentration regions 61, the p-type low-concentration regions 65, and the p-type low-concentration connecting portions 63 are disposed in a grid-like shape surrounding peripheries of the n-type regions 82 disposed in a matrix-like patterned when viewed from a surface of the n⁻-type epitaxial layer 12a. Further, the p⁺-type high-concentration regions 64 and the p⁺-type regions 81 disposed on the p-type low-concentration regions 61 and the p-type low-concentration regions 65, respectively, form a striped pattern that extends in the first direction X.

A distance between one of the p-type low-concentration regions 61 and an adjacent one of the p-type low-concentration regions 65 is, for example, in a range of about 0.5 μm to 1.5 μm. As described above, the p-type low-concentration regions 61 are formed so that the depth d1 from the bottoms of the trenches 37 formed by a subsequent process is, for example, in a range of about 0.7 μm to 1.1 μm (refer to FIG. 2). As described above, the impurity concentration of the p-type low-concentration regions 61 is, for example, in a range of about $3\times10^{17}/cm^3$ to $9\times10^{17}/cm^3$. As described above, the interval w2 between any adjacent two of the p-type low-concentration connecting portions 63 in the first direction X is, for example, about 3 μm or less.

Here, while the p-type low-concentration connecting portions 63 are formed concurrently with the p-type low-concentration regions 61 and/or the p-type low-concentration regions 65, the p-type low-concentration connecting portions 63 suffice to have about the same impurity concentration as that of the p-type low-concentration regions 61 and/or the p-type low-concentration regions 65 and may be formed at a timing different from that of the p-type low-concentration regions 61 and/or the p-type low-concentration regions 65. The n-type regions 82 are formed so that the depth d1 from the bottoms of the trenches 37 formed by a subsequent process is, for example, in a range of about 0.7 μm to 1.1 μm (refer to FIG. 2). The n-type regions 82 have an impurity concentration that is, for example, in a range of about $3\times10^{17}/cm^3$ to $9\times10^{17}/cm^3$.

Figure 9:
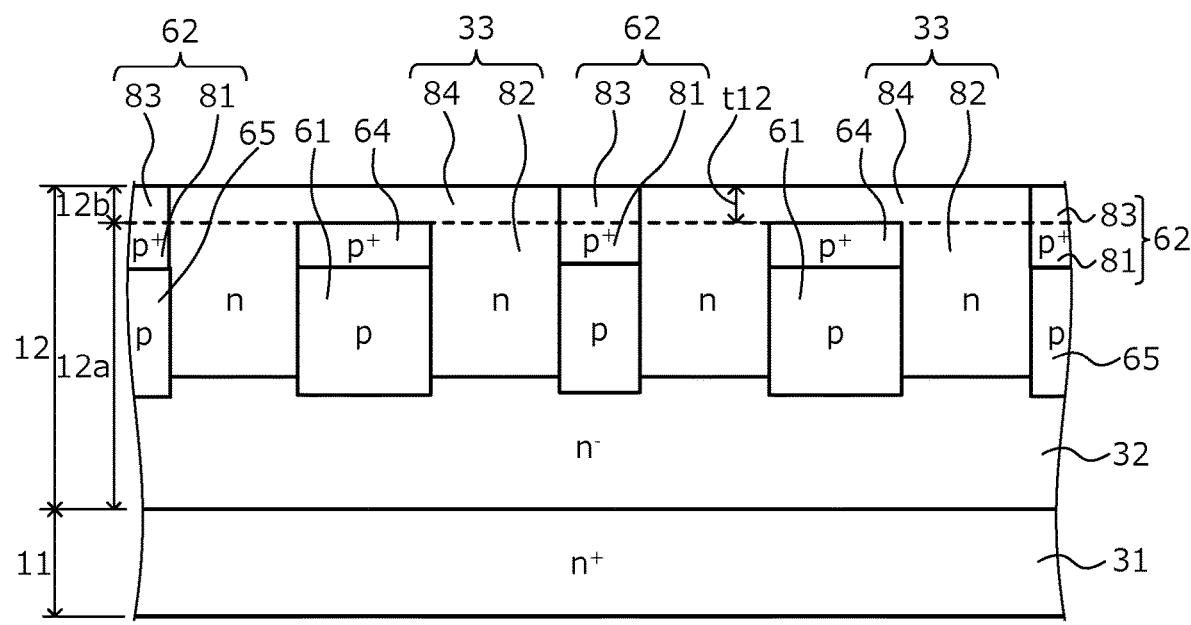
FIG. 9 is a cross-sectional view depicting a state of the semiconductor device according to the first embodiment during manufacture.

Next, as depicted in FIG. 9, on the n⁻-type epitaxial layer 12a, for example, an n⁻-type epitaxial layer 12b (12) doped with an n-type impurity such as nitrogen is further epitaxially grown to have a thickness t12 of, for example, about 0.5 μm, whereby the n⁻-type epitaxial layer 12 (12a, 12b) has a predetermined thickness. The n⁻-type epitaxial layer 12 has an impurity concentration that is, for example, about $3\times10^{15}/cm^3$. Next, by photolithography and ion implantation of a p-type impurity such as Al, the p⁺-type regions 83 that constitute portions of the p⁺-type high-concentration regions 62 are formed in the n⁻-type epitaxial layer 12b.

Next, n-type regions 84 that constitute portions of the n-type current spreading regions 33 are formed in the n⁻-type epitaxial layer 12b by photolithography and for example, ion implantation of an n-type impurity such as nitrogen. The p⁺-type regions 81, 83 that are adjacent to each other in the depth direction Z are connected, thereby forming the p⁺-type high-concentration regions 62. The n-type regions 82, 84 that are adjacent to each other the depth direction Z are connected, thereby forming the n-type current spreading regions 33. Conditions such as impurity concentrations of the p⁺-type regions 83 and the n-type regions 84, for example, are the same as those for the p⁺-type regions 81 and the n-type regions 82, respectively. The sequence in which the p⁺-type regions 83 and the n-type regions 84 are formed may be interchanged.

Figure 10:
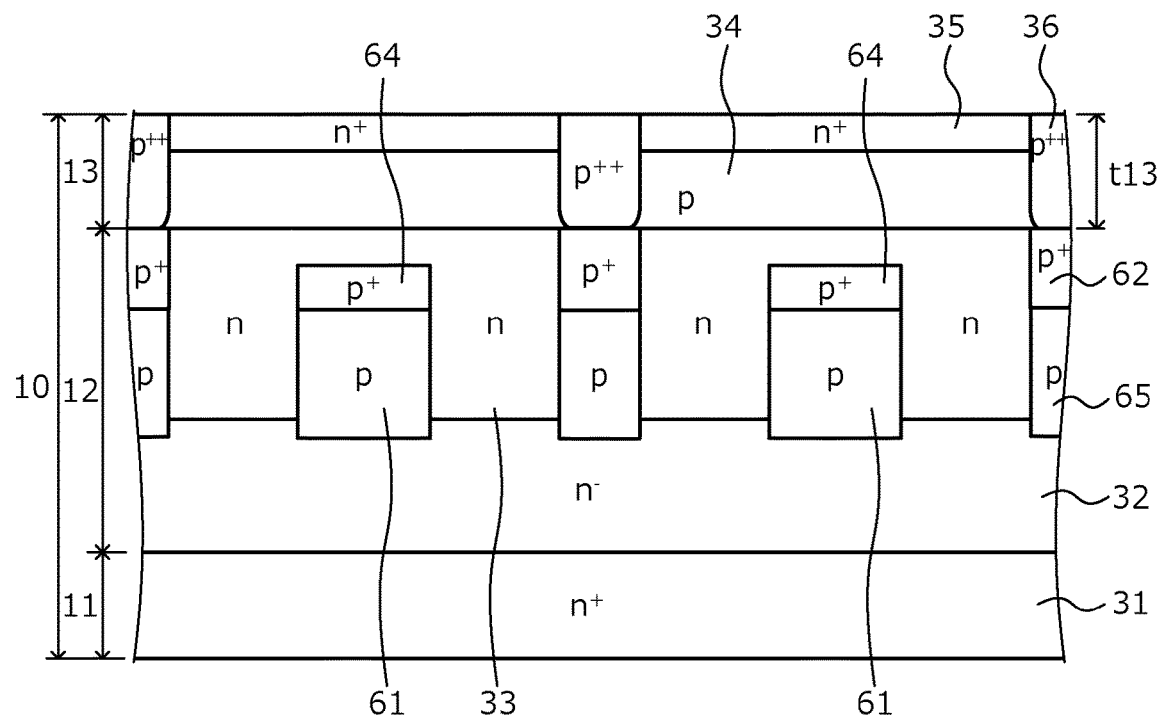
FIG. 10 is a cross-sectional view depicting a state of the semiconductor device according to the first embodiment during manufacture.

Next, as depicted in FIG. 10, on the n⁻-type epitaxial layer 12, for example, the p-type epitaxial layer 13 doped with a p-type impurity such as aluminum is epitaxially grown. The p-type epitaxial layer 13 has a thickness t13 of about 1.3 μm and an impurity concentration of about $4\times10^{17}/cm^3$, for example. By the processes up to here, the semiconductor substrate (semiconductor wafer) 10 in which the epitaxial layers 12, 13 are sequentially stacked on the n⁺-type starting substrate 11 is completed.

Next, the n⁺-type source regions 35 are selectively formed in surface regions of the p-type epitaxial layer 13 by photolithography and ion implantation of an n-type impurity such as phosphorus (P). Next, the p⁺⁺-type contact regions 36 are selectively formed in surface regions of the p-type epitaxial layer 13 by photolithography and ion implantation of a p-type impurity such as aluminum. The p⁺⁺-type contact regions 36 may be formed such that lower surfaces thereof are in contact with the p⁺-type high-concentration regions 62. A portion of the p-type epitaxial layer 13 left as a p-type, free of implanted ions constitutes the p-type base region 34. The sequence in which the n⁺-type source regions 35 and the p⁺⁺-type contact regions 36 are formed may be interchanged.

Diffused regions formed by ion implantation may be formed by multistage ion implantation in which predetermined dose amounts are divided into multiple sessions (stages) and implanted under different conditions. Next, a heat treatment (hereinafter, activation annealing) for activating the impurities ion-implanted in the epitaxial layers 12, 13 is performed. The activation annealing may be performed one time collectively after all the diffused regions are formed or may be performed each time diffused regions are formed by ion implantation. A temperature and period of the activation annealing, for example, may be about 1700 degrees C. and about 2 minutes, respectively.

By the activation annealing, impurities in all the diffused regions formed by ion implantation (the n-type current spreading regions 33, the p-type low-concentration regions 61, the p-type low-concentration regions 65, the p-type low-concentration connecting portions 63, the $p^+$-type high-concentration regions 62, the $p^+$-type high-concentration regions 64, the $n^+$-type source regions 35, and the $p^{++}$-type contact regions 36) are activated and according to Gauss's law, impurity diffusion occurs corresponding to each of the impurity concentrations and impurity diffusion coefficients.

Figure 11:
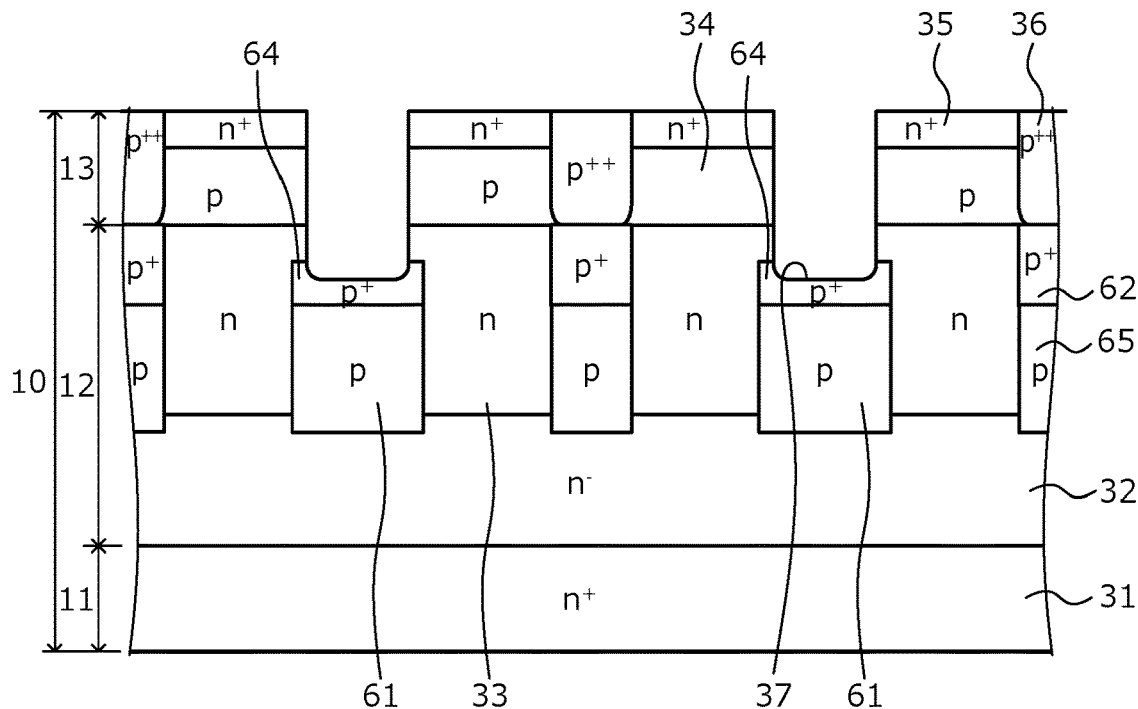
FIG. 11 is a cross-sectional view depicting a state of the semiconductor device according to the first embodiment during manufacture.

Next, as depicted in FIG. 11, by photolithography and for example, dry etching, the trenches 37 are formed penetrating through the $n^+$-type source regions 35 and the p-type base region 34 in the depth direction Z from the front surface of the semiconductor substrate 10, at positions facing the $p^+$-type high-concentration regions 64 in the depth direction Z. The trenches 37 may terminate at positions closer to the front surface of the semiconductor substrate 10 than are the $p^+$-type high-concentration regions 64 or may reach the $p^+$-type high-concentration regions 64.

Figure 12:
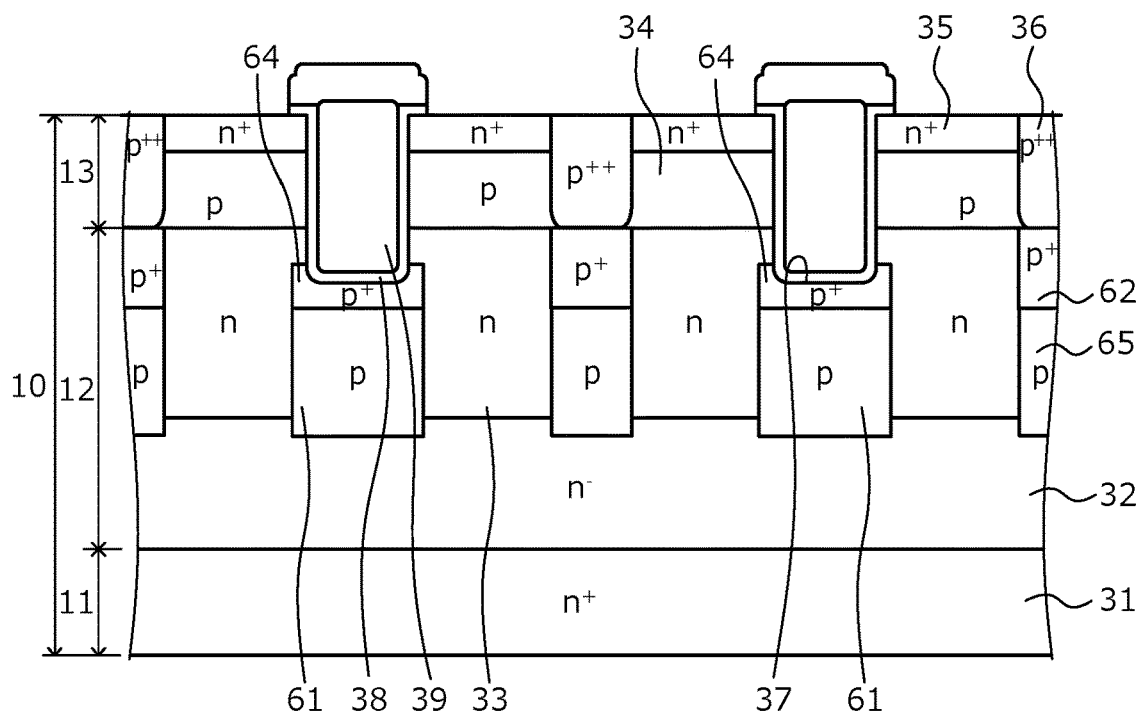
FIG. 12 is a cross-sectional view depicting a state of the semiconductor device according to the first embodiment during manufacture.

Next, as depicted in FIG. 12, along the front surface of the semiconductor substrate 10 and inner walls (sidewalls and bottoms) of the trenches 37, the gate insulating film 38 is formed in contact with the $n^+$-type source regions 35, the p-type base region 34, and the n-type current spreading regions 33. The gate insulating film 38 may be, for example, a thermal oxide film formed by thermally oxidating semiconductor surfaces by a temperature of about 1000 degrees C. under an oxygen ($O_2$) atmosphere or may be deposited by high-temperature oxidation like that for a high temperature oxide (HTO).

Next, a polysilicon (poly-Si) layer doped with, for example, phosphorus (P) is deposited (formed) on the front surface of the semiconductor substrate 10 so as to be embedded in the trenches 37. Next, the polysilicon layer is selectively removed and only portions thereof constituting the gate electrodes 39 are left in the trenches 37.

Next, on entire area of the front surface of the semiconductor substrate 10, the interlayer insulating film 40 containing, for example, a borophosphosilicate glass (BPSG), PSG, and covering the gate electrodes 39 is formed to have a thickness of, for example, 1 μm. Next, by photolithography and etching, the contact holes 40a that penetrate through the interlayer insulating film 40 and the gate insulating film 38 in the depth direction Z are formed. In the contact holes 40a, the $n^+$-type source regions 35 and the $p^{++}$-type contact regions 36 are exposed. Next, the interlayer insulating film 40 planarized (reflow) by a heat treatment.

Next, in the active region 1, the first TiN film 42 that covers only the interlayer insulating film 40 is formed. Next, by a general method, in the contact holes 40a of the interlayer insulating film 40, the NiSi films 41 that are in ohmic contact with the front surface of the semiconductor substrate 10 are formed. Further, as the drain electrode 52, a NiSi film that is in ohmic contact with the back surface of the semiconductor substrate 10 is formed. The NiSi film is formed by causing a nickel film to react with the semiconductor substrate 10 by a heat treatment at a temperature of, for example, about 970 degrees C.

Next, by a sputtering method, the first Ti film 43, the second TiN film 44, and the second Ti film 45 are sequentially stacked so as to cover the NiSi films 41 and the first TiN film 42, whereby the barrier metal 46 is formed covering an entire area of the surface of the active region 1. Next, the Al electrode film 47 is deposited on the second Ti film 45. Further, concurrently with the Al electrode film 47, a gate pad (not depicted) is formed on the interlayer insulating film 40, separate from the Al electrode film 47. Next, on the surface of the drain electrode 52, for example, a Ti film, a Ni film, and a gold (Au) film are sequentially stacked, thereby forming the drain pad (not depicted).

Next, on an entire area of the front surface of the semiconductor substrate 10, the first protective film 50 containing an organic high-polymer material such as a polyimide is formed, whereby the Al electrode film 47 and the gate pad are covered by the first protective film 50. Next, the first protective film 50 is selectively removed, thereby forming different openings in which the Al electrode film 47 (the source pad) and the gate pad are exposed, respectively. Next, a general plating pre-treatment is performed and thereafter, the plating films 48 are formed by a general plating treatment in the openings of the first protective film 50. Next, the plating films 48 are dried by a heat treatment (baking).

Next, the second protective films 51 containing an organic high-polymer material such as a polyimide are formed covering the borders between the plating films 48 and the first protective film 50. Next, the strength of the first and second protective films 50, 51 is enhanced by a heat treatment (curing). Next, the terminal pins 49 are bonded on the plating films 48, respectively, by a soldering layer. On the gate pad as well, a wiring structure to which terminal pins are bonded similarly to those on the Al electrode film 47 is formed. Thereafter, the semiconductor wafer (the semiconductor substrate 10) is diced (cut) into individual chips, whereby the MOSFET depicted in FIGS. 1 to 6 is completed.

As described above, according to the first embodiment, the impurity concentration of the p-type low-concentration regions that face the bottoms of the trenches is low, whereby the p-type low-concentration regions are formed by ion implantation of a low dose amount, thereby enabling the width of each of the p-type low-concentration regions to be reduced. The resistance value of the JFET resistance, which is internal resistance of the semiconductor substrate, may be reduced according to the extent to which the width of each of the p-type low-concentration regions is reduced and therefore, on-resistance may be reduced. Alternatively, the size of each unit cell may be reduced according to the extent to which the width of the p-type low-concentration regions is reduced and the unit cell density may be increased. Thus, the unit cell density of the active region is increased, and the on-resistance may be decreased while the resistance value of the JFET resistance is maintained.

Further, according to the first embodiment, the depletion layer that spreads from the main junctions (pn junctions) of the active region in the off-state does not easily spread in the $p^+$-type high-concentration regions between the bottoms of the trenches and the p-type low-concentration regions. Therefore, even when the impurity concentration of the p-type low-concentration regions is low, the electric field applied to the gate insulating film at the bottoms of the trenches may be mitigated. Further, according to the first embodiment, the interval between the p-type low-concentration connecting portions that connect the p-type low-concentration regions that are adjacent to one another is reduced to about 3 μm or less, whereby in a narrow range of about 3 μm or less in the first direction, the total p-type impurity concentration per predetermined unit area near the bottoms of the trenches increases, whereby depletion of the p-type low-concentration regions becomes difficult. Thus, the electric field applied to the gate insulating film at the bottoms of the trenches may be further mitigated.

Further, according to the first embodiment, application of the method of manufacturing the conventional semiconductor device (refer to FIGS. 17 to 21) is possible. In particular, the p-type low-concentration regions and the p-type low-concentration connecting portions of the first embodiment may be easily formed by changing the impurity concentrations of the first $p^+$-type high-concentration regions and the $p^+$-type high-concentration connecting portions and the pitch of the $p^+$-type high-concentration connecting portions of the conventional semiconductor device. Further, according to the first embodiment, the impurity concentrations of the p-type low-concentration regions and the p-type low-concentration connecting portions and the pitch of the p-type low-concentration connecting portions are optimized, whereby the electric field applied to the gate insulating film at the bottoms of the trenches is mitigated. Thus, design of the semiconductor device is facilitated.

Figure 13:
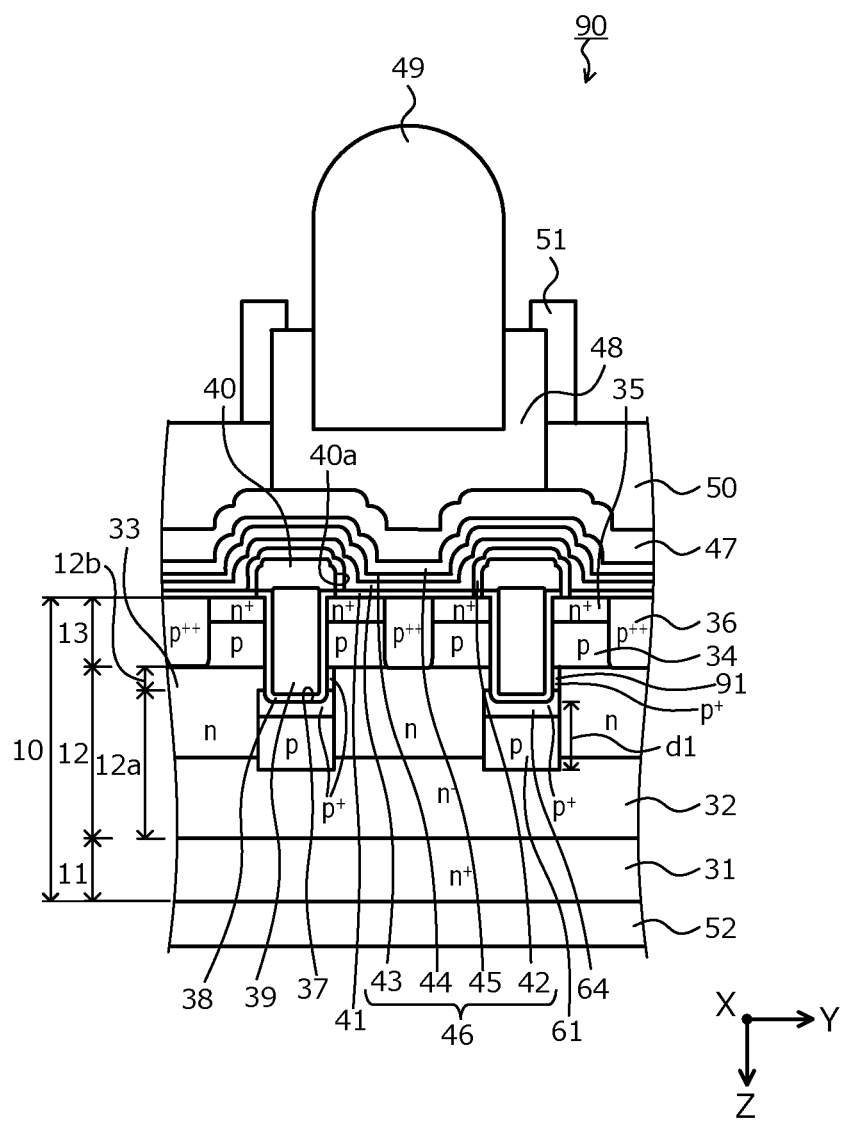
FIG. 13 is a cross-sectional view of a portion of a structure of a semiconductor device according to a second embodiment.

A structure of a semiconductor device according to a second embodiment is described. FIG. 13 is a cross-sectional view of a portion of the structure of the semiconductor device according to the second embodiment. An overall layout of a semiconductor device 90 according to the second embodiment when viewed from the front side of the semiconductor substrate 10 is similar to that depicted in FIG. 1. In the semiconductor device 90 according to the second embodiment, instead of the $p^+$-type high-concentration regions 62 (refer to FIG. 2), the p-type low-concentration regions 61 and the p-type low-concentration connecting portions 63 are electrically connected to the p-type base region 34 by $p^+$-type high-concentration connecting portions 91. The semiconductor device 90 according to the second embodiment has a structure in which in FIGS. 3 and 6, the $p^+$-type high-concentration regions 62 (depicted only in FIG. 3) and the p-type low-concentration regions 65 are omitted and the cell pitch is reduced, the semiconductor device 90 further having the structure depicted in FIG. 4 and the structure depicted in FIG. 13. FIG. 13 corresponds to a cross-section of the structure along cutting line A1-A1' in an instance in which the p-type low-concentration regions 65 are omitted from the structure in FIG. 6 and the cell pitch is reduced. In particular, the semiconductor device 90 according to the second embodiment differs from the semiconductor device 30 according to the first embodiment (refer to FIG. 2) on the following 2 points.

The first difference is that between the trenches 37 that are adjacent to each other is free of the p-type regions (correspond to reference numerals 62 and 65 in FIG. 2) for mitigating the electric field applied to the gate insulating film 38 at the bottoms of the trenches 37 (refer to FIG. 13). Therefore, the $p^{++}$-type contact regions 36 need not be of a depth reaching the bottom of the p-type base region 34 (not depicted). As described above, the p-type low-concentration regions 61 that face the trenches 37 are formed by ion implantation with a low dose amount and impurity diffusion is difficult, whereby the cell pitch may be reduced. Further, in an instance in which the cell pitch is sufficiently reduced, the electric field applied to the gate insulating film 38 at the bottoms of the trenches 37 is sufficiently mitigated by the p-type low-concentration regions 61, the p-type low-concentration connecting portions 63, and the $p^+$-type high-concentration regions 64 alone. Further, the $p^+$-type high-concentration regions between the trenches 37 that are adjacent to each other are not provided, whereby the cell pitch may be further reduced.

The second difference is that the $p^+$-type high-concentration regions 64 are connected to the p-type base region 34 at predetermined locations by the $p^+$-type high-concentration connecting portions (first high-concentration regions) 91 (refer to FIG. 13). The p-type low-concentration regions 61 and the $p^+$-type high-concentration regions 64 are fixed to the potential of the source electrode by the $p^+$-type high-concentration connecting portions 91. The $p^+$-type high-concentration connecting portions 91 are disposed scattered along the first direction X at positions so as to be in contact with the gate insulating film 38 at one of the sidewalls of each of the trenches 37 (not depicted). The $p^+$-type high-concentration connecting portions 91 extend along the one sidewall of each of the trenches 37, from the $p^+$-type high-concentration regions 64 to the p-type base region 34 and thereby, connects the $p^+$-type high-concentration regions 64 and the p-type base region 34. The other sidewall of each of the trenches 37 is free of the $p^+$-type high-concentration connecting portions 91.

Portions where the $p^+$-type high-concentration connecting portions 91 are formed do not constitute a path of current when the MOSFET is on, similarly to the portions where the p-type low-concentration connecting portions 63 are formed. The $p^+$-type high-concentration connecting portions 91 are provided only at the one sidewall of each of the trenches 37, whereby further reduction of the area of the channel may be suppressed. The $p^+$-type high-concentration connecting portions 91 may be disposed along the first direction X at positions different from those of the p-type low-concentration connecting portions 63 or may be disposed at positions to be in contact with the p-type low-concentration connecting portions 63. Between the trenches 37 that are adjacent to each other, an interval at which the $p^+$-type high-concentration connecting portions 91 are scattered along the first direction X may be wider than the interval w2 at which the p-type low-concentration connecting portions 63 are scattered along the first direction X. The $p^+$-type high-concentration connecting portions 91 may constitute portions of the $p^+$-type high-concentration regions 64. Further, the $p^+$-type high-concentration connecting portions 91 may be disposed in a striped pattern that extends along the one sidewall of the trenches 37 in the first direction X.

A method of manufacturing the semiconductor device 90 according to the second embodiment may be implemented by omitting the process of forming the $p^+$-type high-concentration regions 62 and the p-type low-concentration regions 65 in the method of manufacturing the semiconductor device 30 according to the first embodiment and adding thereto a process of selectively forming the $p^+$-type high-concentration connecting portions 91 in the $n^-$-type epitaxial layer 12b by photolithography and, for example, ion implantation of a p-type impurity such as Al.

As described above, according to the second embodiment, the cell pitch is reduced, whereby effects similar to those of the first embodiment may be obtained without providing, the $p^+$-type high-concentration regions near the bottoms of the trenches, between the trenches that are adjacent to each other.

The structure of the edge termination region 2 and the intermediate region 3 of the semiconductor device 30 according to the first embodiment is described as a third embodiment. FIG. 14 is a cross-sectional view depicting the structure along cutting line C-C' in FIG. 1. As depicted in FIG. 14, at the front surface of the semiconductor substrate 10, a portion of the p-type epitaxial layer 13 in the edge termination region 2 is removed by etching, whereby a recess 53 is formed. The front surface of the semiconductor substrate 10 has a portion (hereinafter, first surface portion) 10a that is in the active region 1 and the intermediate region 3 and that borders the recess 53, and a portion (hereinafter, second surface portion) 10b that is in the edge termination region 2 and recessed toward the $n^+$-type drain region 31.

The second surface portion 10b of the front surface of the semiconductor substrate 10 is a surface of the $n^-$-type epitaxial layer 12 exposed by the formation of the recess 53. During formation of the recess 53, the p-type epitaxial layer 13 and a surface region of the $n^-$-type epitaxial layer 12 therebelow may be slightly removed. The front surface of the semiconductor substrate 10 further has a portion (hereinafter, third surface portion, a mesa edge of the recess 53) 10c that connects the first surface portion 10a and the second surface portion 10b, the third surface portion 10c separates device elements of the active region 1 and the intermediate region 3 from those of the edge termination region 2. The third surface portion 10c of the front surface of the semiconductor substrate 10 is a side surface of the p-type epitaxial layer 13 exposed by the formation of the recess 53.

In the intermediate region 3 and the edge termination region 2, the first to the third surface portions 10a to 10c of the front surface of the semiconductor substrate 10 are covered by an insulating layer in which a field oxide film 71 and the interlayer insulating film 40 are sequentially stacked. In the outer periphery of the active region 1, the contact hole 40b is formed in the field oxide film 71 and the interlayer insulating film 40, the contact hole 40b having a substantially rectangular shape surrounding the periphery of the active region 1. In the contact hole 40b, the outer peripheral $p^{++}$-type contact region 36a is exposed and one of the NiSi films 41 is provided in ohmic contact with the outer peripheral $p^{++}$-type contact region 36a. No field plate (conductive film) is provided.

In the intermediate region 3, on the field oxide film 71, a gate polysilicon wiring layer 72 constituting a gate runner and a gate metal wiring layer 73 are sequentially stacked closer to the chip end than is the contact hole 40b. The gate polysilicon wiring layer 72 and the gate metal wiring layer 73 surround the periphery of the active region 1 in a substantially rectangular shape. The gate polysilicon wiring layer 72 faces ends of the trenches 37 along the depth direction Z and is in contact with the gate electrodes 39 at the ends of the trenches 37. All the gate electrodes 39 are electrically connected to the gate pad (not depicted) via the gate polysilicon wiring layer 72 and the gate metal wiring layer 73.

In the intermediate region 3, the p-type base region 34 extends from the active region and reaches the third surface portion 10c of the front surface of the semiconductor substrate 10. The p-type base region 34 is provided in an entire area of the active region 1 and the intermediate region 3. An outer peripheral portion (hereinafter, outer peripheral p-type base region) 34a of the p-type base region 34 surrounds the periphery of the active region 1 in a substantially rectangular shape. The outer peripheral p-type base region 34a is a portion of the p-type base region 34, closer to the chip end along the first direction X (longitudinal direction of the trenches 37) than are the $n^+$-type source regions 35 and a portion closer to the chip end along the second direction Y (latitudinal direction of the trenches 37) than are the outermost trenches 37 along the second direction Y.

In an entire area between the first surface portion 10a of the front surface of the semiconductor substrate 10 and the outer peripheral p-type base region 34a, one of the $p^{++}$-type contact regions 36 (hereinafter, the outer peripheral $p^{++}$-type contact region 36a) is provided in contact with the outer peripheral p-type base region 34a. FIG. 14 depicts an instance in which the depth of the $p^{++}$-type contact regions 36 is shallower than the depth of the p-type base region 34. The outer peripheral $p^{++}$-type contact region 36a is exposed at the first surface portion 10a of the front surface of the semiconductor substrate 10. Here, being exposed at the first surface portion 10a of the front surface of the semiconductor substrate 10 means the outer peripheral $p^{++}$-type contact region 36a is in contact with one of the NiSi films 41 by the contact hole 40b that is outermost in the interlayer insulating film 40. The outer peripheral $p^{++}$-type contact region 36a surrounds the periphery of the active region 1 in a substantially rectangular shape.

The outer peripheral $p^{++}$-type contact region 36a is in contact with the gate insulating film 38 at one sidewall of each of the outermost trenches 37, the one sidewall being that closest to the chip end. The outer peripheral $p^{++}$-type contact region 36a has a function of pulling out holes that accumulate in the edge termination region 2 due to switching, etc. of the MOSFET, the holes being pulled out to the source electrode via the outer peripheral $p^+$-type region 62a and the outer peripheral p-type base region 34a when the MOSFET turns off. The outer peripheral $p^{++}$-type contact region 36a may be omitted. In this instance, instead of the outer peripheral $p^{++}$-type contact region 36a, the outer peripheral p-type base region 34a reaches and is exposed at the first surface portion 10a of the front surface of the semiconductor substrate 10.

A p-type low-concentration region (hereinafter, outer peripheral p-type low-concentration region) 65a and a $p^+$-type high-concentration region (hereinafter, outer peripheral $p^+$-type region) 62a are provided to be separate from the outermost trenches 37 and adjacent to the outer peripheral p-type base region 34a in the depth direction Z. The outer peripheral $p^+$-type region 62a and the outer peripheral p-type low-concentration region 65a surround the periphery of the active region 1 in a substantially rectangular shape. The outer peripheral $p^+$-type region 62a is in contact with the ends of all the $p^+$-type high-concentration regions 64 and the ends of all the $p^+$-type high-concentration regions 62. The outer peripheral p-type low-concentration region 65a is in contact with the ends of all the p-type low-concentration regions 61 and the ends of all the p-type low-concentration regions 65. The outer peripheral p-type low-concentration region 65a is provided so as to be in contact with a lower surface of the outer peripheral $p^+$-type region 62a. The outer peripheral $p^+$-type region 62a extends closer to the chip end than is the mesa edge of the recess 53 and may be exposed at the second surface portion 10b of the front surface of the semiconductor substrate 10. Being exposed at the second surface portion 10b of the front surface of the semiconductor substrate 10 means being in contact with the field oxide film 71 on the second surface portion 10b.

In the edge termination region 2, in surface regions (surface regions of the $n^-$-type epitaxial layer 12) at the second surface portion 10b of the front surface of the semiconductor substrate 10, the FLRs 23 configuring a FLR structure 20 have a floating potential and the same structure and are provided apart from one another while the $n^+$-type channel stopper region 24 is provided separate from the FLR structure 20, closer to the chip end than is the FLR structure 20. The FLRs 23 are provided closer to the chip end than are the outer peripheral $p^+$-type region 62a and the outer peripheral p-type low-concentration region 65a, the FLRs 23 being provided apart from one another between the $n^+$-type channel stopper region 24 and the outer peripheral p$^+$-type region 62a and between the n$^+$-type channel stopper region 24 and the outer peripheral p-type low-concentration region 65a; the FLRs 23 surround the periphery of the active region 1 in a concentric shape with the intermediate region 3 being between the active region 1 and the FLRs 23.

An innermost one of the FLRs 23 is closest to the active region 1 while an outermost one of the FLRs 23 is closest to the chip end; and the n$^-$-type drift region 32 is between the innermost one of the FLRs 23 and the outer peripheral p$^+$-type region 62a, between adjacent FLRs of the FLRs 23, and between the outermost one of the FLRs 23 and the n$^+$-type channel stopper region 24. The FLRs 23 may be configured by p-type low-concentration regions 21 (hatched portions) that are formed concurrently with the p-type low-concentration regions 61, the p-type low-concentration regions 65, or the p-type low-concentration connecting portions 63. The FLRs 23 are formed concurrently with the p-type low-concentration regions 61 of the active region 1, whereby processes for forming the FLR structure 20 need not be separately performed, thereby enabling simplification of manufacturing processes.

The FLRs 23 may have a 2-layer structure including the p-type low-concentration regions 21 formed concurrently with the p-type low-concentration regions 61, the p-type low-concentration regions 65 or the p-type low-concentration connecting portions 63, and p$^+$-type high-concentration regions 22 concurrently formed with the p$^+$-type high-concentration regions 62 or the p$^+$-type high-concentration regions 64. The FLRs 23 may have either a single-layer structure or a 2-layer structure, and upper ends (ends facing the second surface portion 10b of the front surface of the semiconductor substrate 10) of the FLRs 23 may be exposed at the second surface portion 10b of the front surface of the semiconductor substrate 10 or may be at a depth position (for example, depth position of an upper surface of the n$^-$-type epitaxial layer 12a) apart from the second surface portion 10b of the front surface of the semiconductor substrate 10.

The n$^+$-type channel stopper region 24 is provided apart from the FLR structure 20, closer to the chip end than is the FLR structure 20. The n$^+$-type channel stopper region 24 is exposed at the second surface portion 10b of the front surface of the semiconductor substrate 10. The n$^+$-type channel stopper region 24 is exposed at the end of the semiconductor substrate 10. The n$^+$-type channel stopper region 24 is provided, whereby the depletion layer that spreads in the n$^-$-type drift region 32, from the active region 1 when the MOSFET is off may be suppressed compared to an instance in which the n$^+$-type channel stopper region 24 is omitted. A channel stopper electrode (not depicted) is not provided.

When the MOSFET is off, pn junctions between the FLRs 23 and the n$^-$-type drift region 32 bear high voltage applied to the edge termination region 2. In particular, when the MOSFET is off, a depletion layer that spreads from main junctions (pn junctions) of the active region 1 further spreads in the edge termination region 2 to the chip end in a direction of a normal, due to the pn junctions between the FLRs 23 and the n$^-$-type drift region 32. A predetermined withstand voltage may be ensured to the extent that the depletion layer spreads toward the chip end, in the edge termination region 2; the predetermined withstand voltage is based on the breakdown field strength of silicon carbide and the depletion layer width (width in a direction from the active region 1 to the chip end (direction of the normal of the FLRs 23, which are disposed in a concentric shape)).

A method of manufacturing the semiconductor device 90 according to the third embodiment may be implemented by further including in the method of manufacturing the semiconductor device 30 according to the first embodiment (refer to FIGS. 7 to 12), forming the FLRs 23 and the n$^+$-type channel stopper region 24 in the edge termination region 2, and forming the gate polysilicon wiring layer 72 and the gate metal wiring layer 73 in the intermediate region 3. The p-type low-concentration regions 21 configuring the FLRs 23 suffice to be formed in the n$^-$-type epitaxial layer 12a, similarly to the p-type low-concentration regions 61 (refer to FIG. 8), the p-type low-concentration regions 65 (refer to FIG. 8), and the p-type low-concentration connecting portions 63 (refer to FIG. 3) of the active region 1.

The p$^+$-type high-concentration regions 22 configuring the FLRs 23 may be formed in the n$^-$-type epitaxial layer 12a concurrently with the p$^+$-type high-concentration regions 64 of the active region 1, or may be formed in the n$^-$-type epitaxial layer 12b concurrently with the p$^+$-type high-concentration regions 62 of the active region 1, or both may be performed. In the edge termination region 2, the n$^+$-type channel stopper region 24 may be formed in a surface region of the n$^-$-type epitaxial layer 12, concurrently with the n$^+$-type source regions 35 in the active region 1, the surface region of the n$^-$-type epitaxial layer 12 being exposed at the second surface portion 10b of the front surface of the semiconductor substrate 10 due to the formation of the recess 53.

The outer peripheral p$^{++}$-type contact region 36a, the outer peripheral p-type base region 34a, the outer peripheral p-type low-concentration region 65a, and the outer peripheral p$^+$-type region 62a may be respectively formed concurrently with the p$^{++}$-type contact regions 36, the p-type base region 34, the p-type low-concentration regions 65, and the p$^+$-type high-concentration regions 62 of the active region 1. The n$^+$-type source regions 35, the p$^{++}$-type contact regions 36, and the outer peripheral p$^{++}$-type contact region 36a may be formed before the recess 53 is formed. The third surface portion 10c of the front surface of the semiconductor substrate 10, for example, may form an obtuse angle (sloped face) with respect to the first and the second surface portions 10a, 10b, or may form a substantially right angle (orthogonal face) therewith. The etching for forming the trenches 37 may be used to form the recess 53.

A portion of the polysilicon layer deposited to form the gate electrodes 39 may be left as the gate polysilicon wiring layer 72. In an instance in which the gate electrodes 39 and the gate polysilicon wiring layer 72 are formed concurrently, the field oxide film 71 is formed after the gate insulating film 38 is formed but before the polysilicon layer is deposited. While not depicted in FIG. 14, the gate insulating film 38 may be left between the front surface of the semiconductor substrate 10 and the field oxide film 71. The contact hole that exposes the gate polysilicon wiring layer 72 suffices to be formed concurrently with the contact holes 40a, 40b. The gate metal wiring layer 73 suffices to be formed concurrently with the Al electrode film 47.

Figure 14:
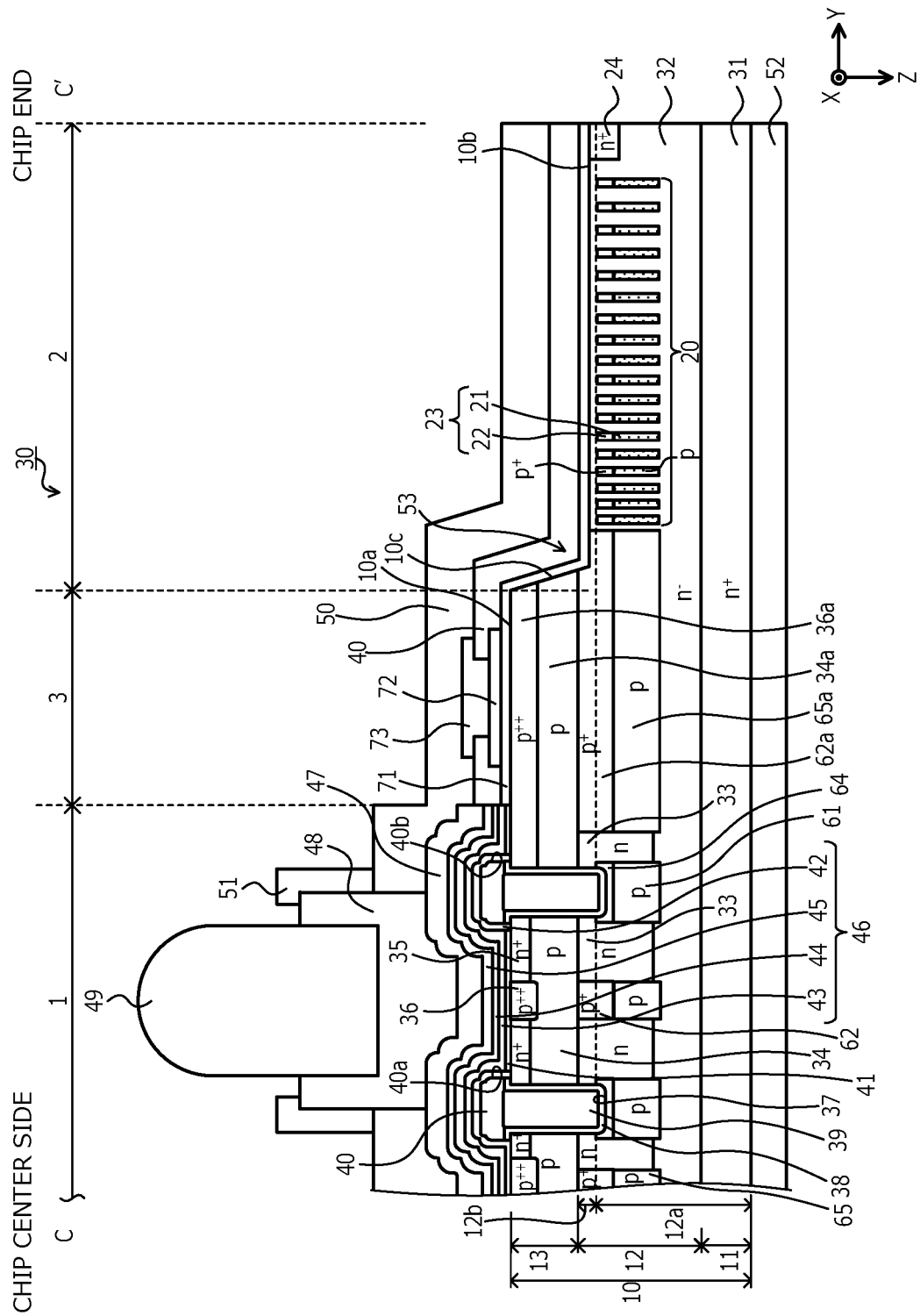
FIG. 14 is a cross-sectional view depicting the structure along cutting line C-C' in FIG. 1.

The edge termination region 2 and the intermediate region 3 depicted in FIG. 14 may be applied to the semiconductor device 90 according to the second embodiment (FIG. 13).

As described above, according to the third embodiment, a process of forming the p-type low-concentration regions near the bottoms of the trenches and the p-type low-concentration connecting portions and a process of forming the FLR in the edge termination region are performed concurrently, thereby enabling simplification of the manufacturing processes.

Figure 15:
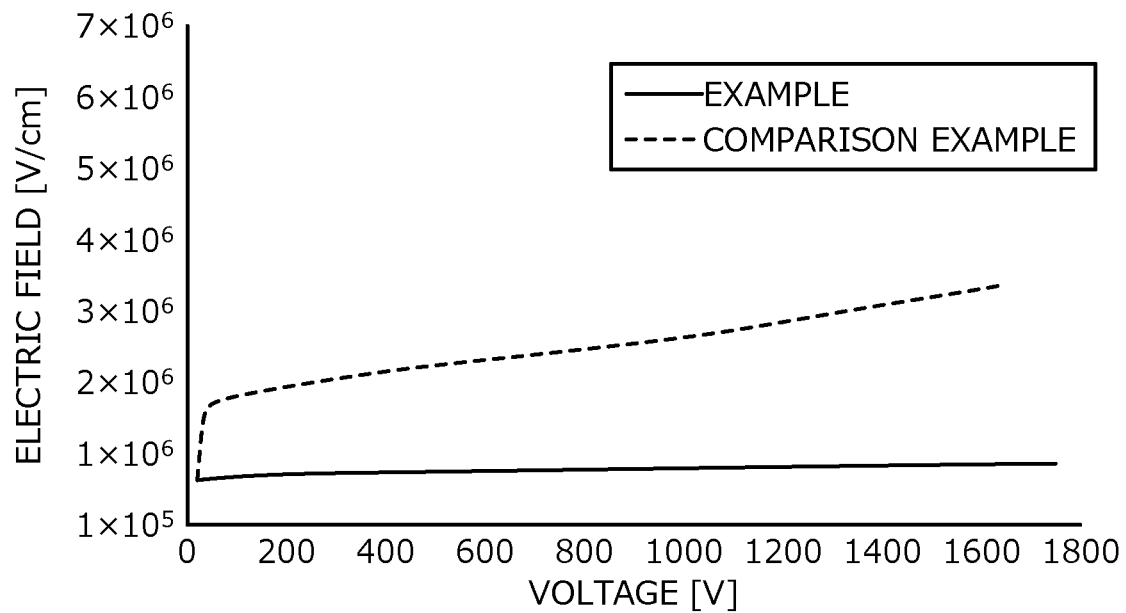
FIG. 15 is a characteristics diagram depicting voltage-electric field characteristics for a first example.

Breakdown voltage and on-resistance of the semiconductor device 30 according to the first embodiment was verified. FIG. 15 is a characteristics diagram depicting voltage-electric field characteristics for a first example. In FIG. 15, a horizontal axis indicates voltage between the source and drain while a vertical axis indicates electric field applied to the gate insulating film 38. Results of simulating the withstand voltage of the semiconductor device 30 according to the first embodiment described above (refer to FIGS. 2 to 6, hereinafter, first example) and a comparison example are shown in FIG. 15. The comparison example differs from the first example in that the comparison example is free of the $p^+$-type high-concentration regions 64 and the interval w2 between the p-type low-concentration connecting portions 63 that are adjacent to one another in the first direction X is greater than 3 μm.

From the results shown in FIG. 15, it was confirmed that in the comparison example, when voltage less than the gate threshold voltage was applied to the gate electrodes 39 and the main junctions (pn junctions) of the active region were reversed biased while forward voltage was applied between the source and drain, the electric field applied to the gate insulating film 38 at the bottoms of the trenches 37 increased. In the comparison example, the impurity concentration of the p-type low-concentration regions 61 facing the bottoms of the trenches 37 is low, whereby the p-type low-concentration regions 61 are completely depleted and thus, the electric field applied to the gate insulating film 38 at the bottoms of the trenches 37 increased.

On the other hand, in the first example, it was confirmed that compared to the comparison example, the electric field applied to the gate insulating film 38 at the bottoms of the trenches 37 is mitigated and voltage-electric field characteristics similar to the voltage-electric field characteristics (not depicted) for the conventional semiconductor device (refer to FIGS. 17 to 21, hereinafter, conventional example) are obtained. In the first example, the depletion layer that spreads when the main junctions of the active region are reverse biased does not easily spread in the $p^+$-type high-concentration regions 64 that are each between a respective one of the bottoms of the trenches 37 and a respective one of the p-type low-concentration regions 61, whereby the electric field applied to the gate insulating film 38 at the bottoms of the trenches 37 is mitigated.

Further, the interval w2 between the p-type low-concentration connecting portions 63 that are adjacent to one another in the first direction X, for example, is reduced to about 3 μm or less, whereby the total p-type impurity concentration per predetermined area near the bottoms of the trenches 37 increases and depletion of the p-type low-concentration regions 61 becomes even more difficult. Therefore, the electric field applied to the gate insulating film 38 at the bottoms of the trenches 37 can be further reduced. As a result, in the first example, even when the impurity concentration of the p-type low-concentration regions 61 is low, the electric field applied to the gate insulating film 38 at the bottoms of the trenches 37 may be mitigated.

Figure 16:
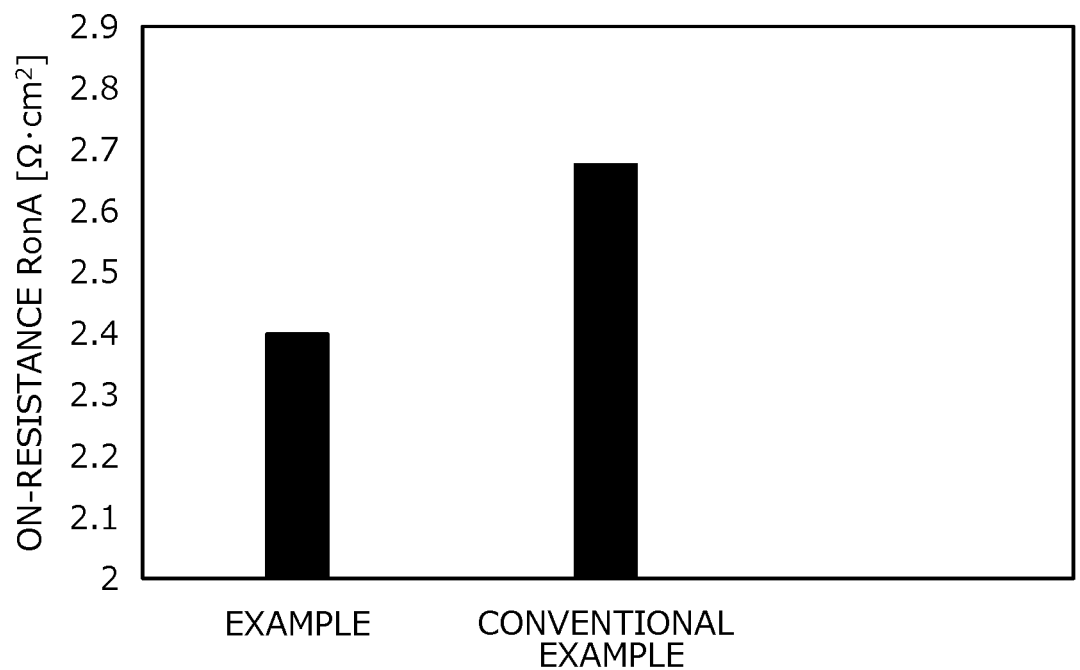
FIG. 16 is a characteristics diagram depicting on-resistance characteristics of the first example.
Figure 17:
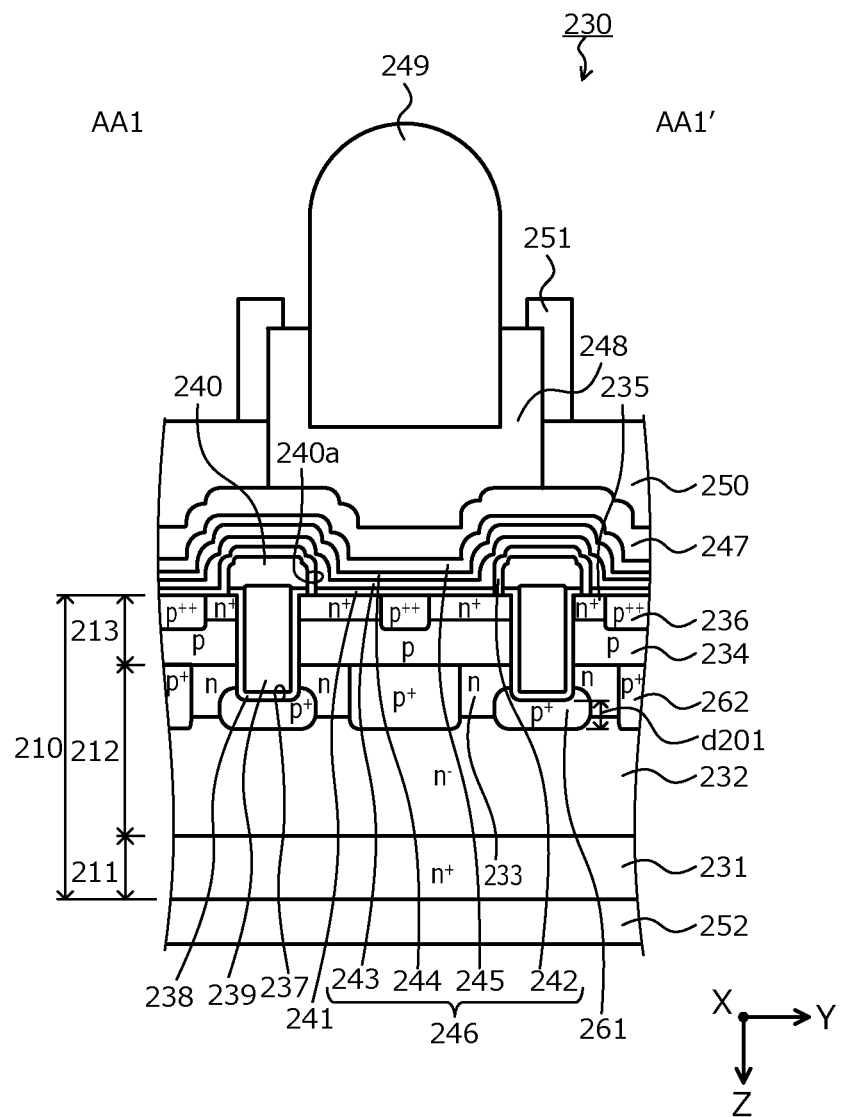
FIG. 17 is a cross-sectional view depicting the structure along cutting line AA1-AA1' in FIG. 21.
Figure 18:
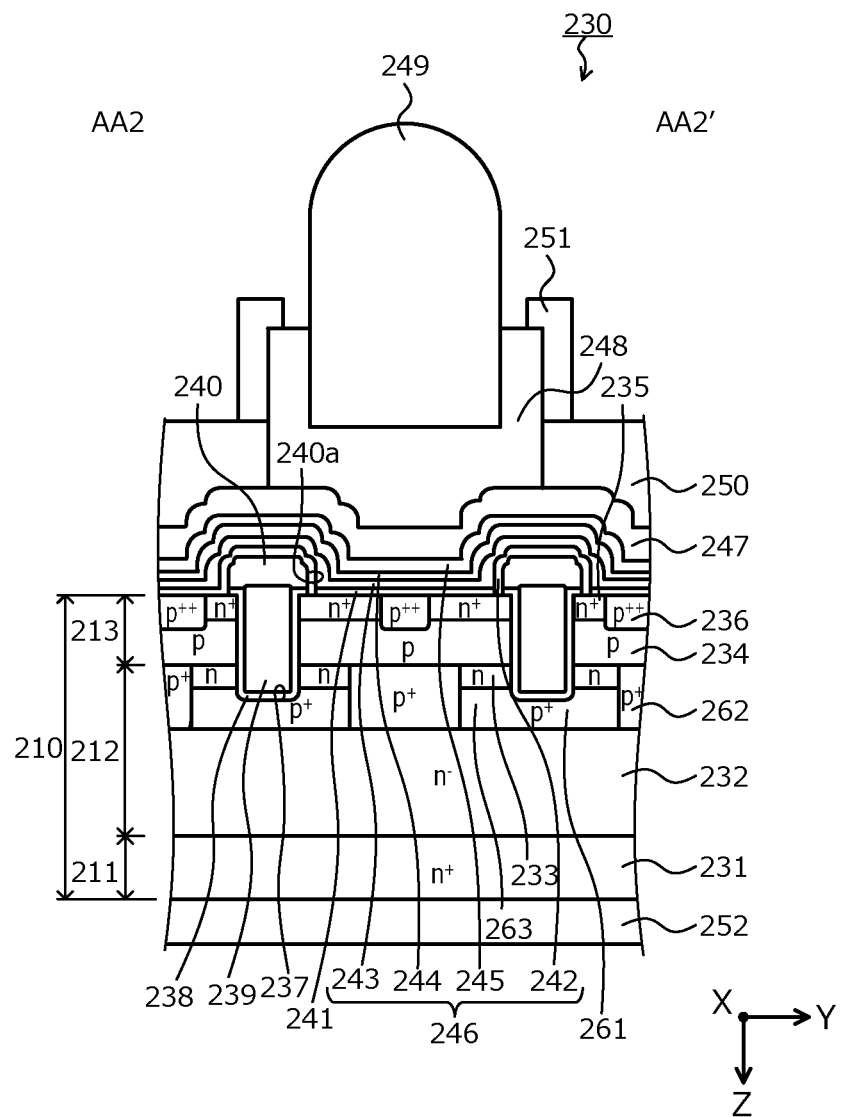
FIG. 18 is a cross-sectional view depicting the structure along cutting line AA2-AA2' in FIG. 21.
Figure 19:
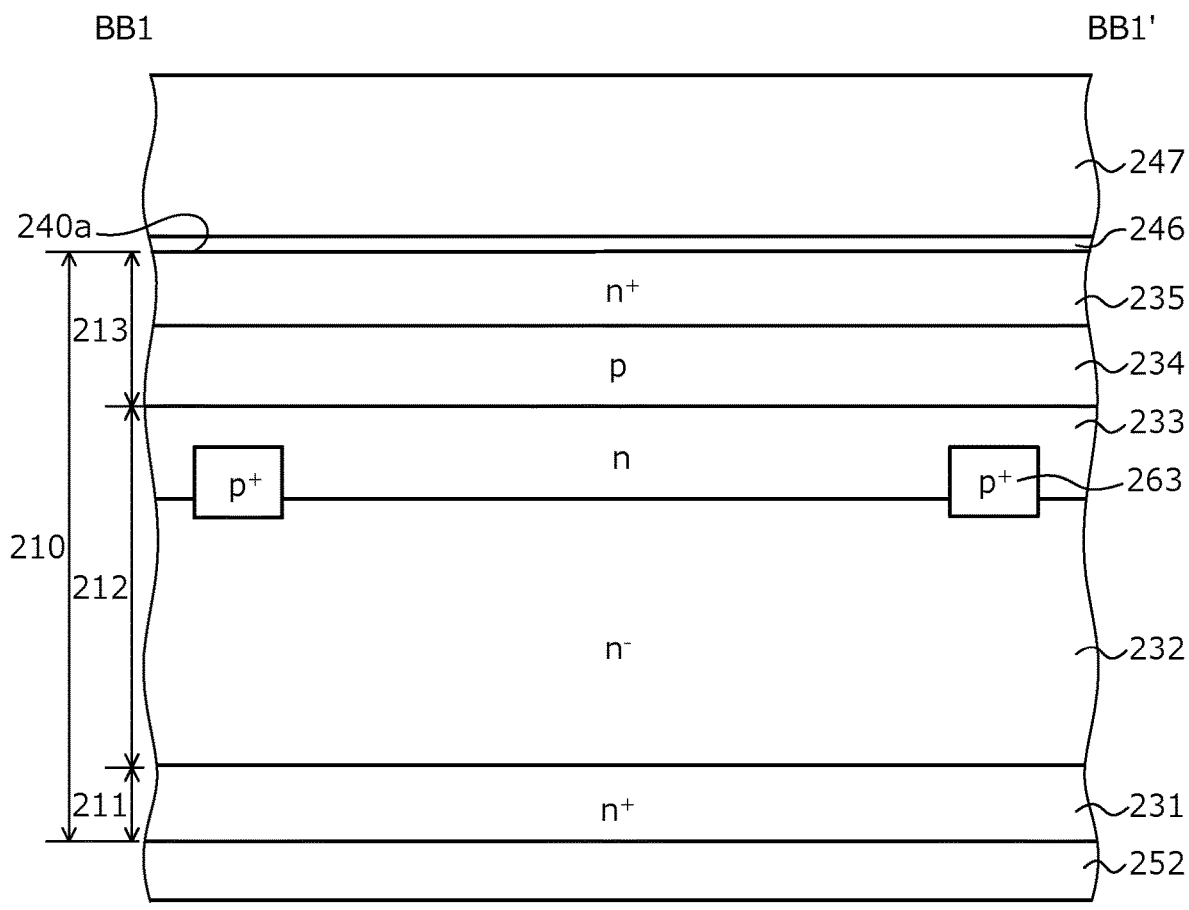
FIG. 19 is a cross-sectional view depicting the structure along cutting line BB1-BB1' in FIG. 21.
Figure 20:
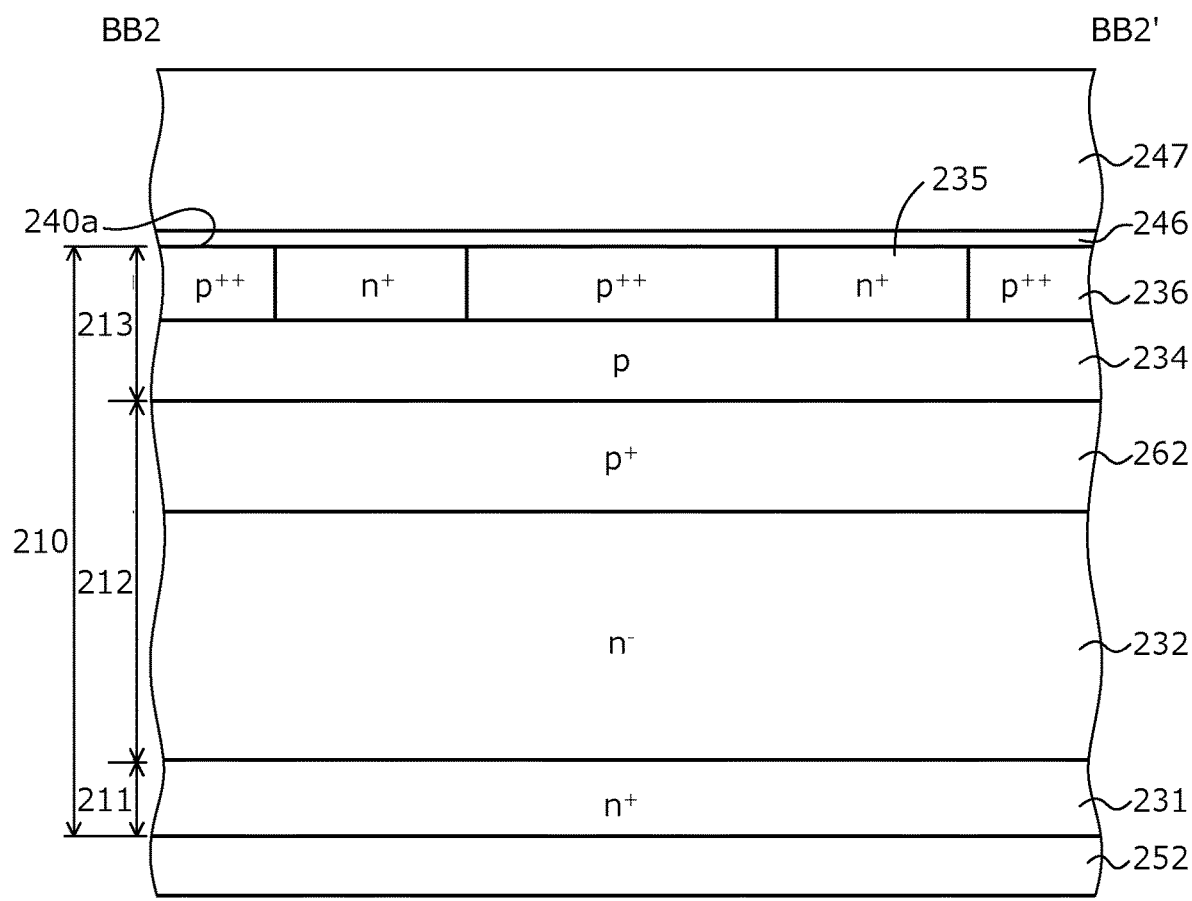
FIG. 20 is a cross-sectional view depicting the structure along cutting line BB2-BB2' in FIG. 21.
Figure 21:
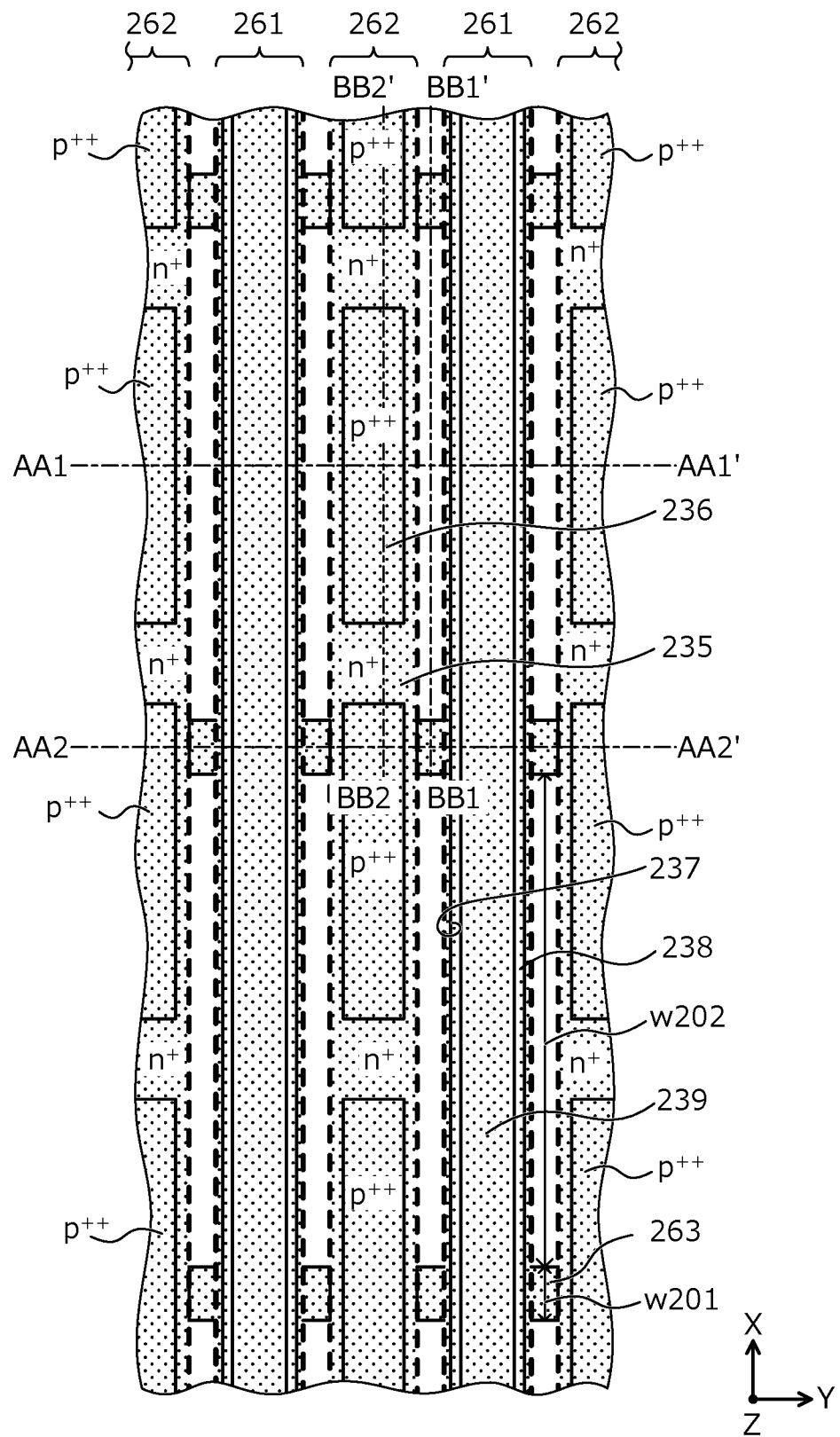
FIG. 21 is a plan view depicting a layout when a portion of a conventional semiconductor device is viewed from a front side of a semiconductor substrate.

FIG. 16 is a characteristics diagram depicting on-resistance (RonA) characteristics of the first example. Results of simulating the on-resistance of the first example described above and the conventional example are shown in FIG. 16. From the results shown n FIG. 16, it was confirmed that in the first example, on-resistance is reduced compared to the conventional example. The p-type low-concentration regions 61 of the first example are formed by ion implantation with a low dose amount, and spreading thereof along the second direction Y is reduced compared to the first $p^+$-type high-concentration regions 261 of the conventional example. As a result, the resistance value of the JFET resistance between any of the p-type low-concentration regions 61 and an adjacent one of the $p^+$-type high-concentration regions 62 may be reduced.

Figures 22, 23:
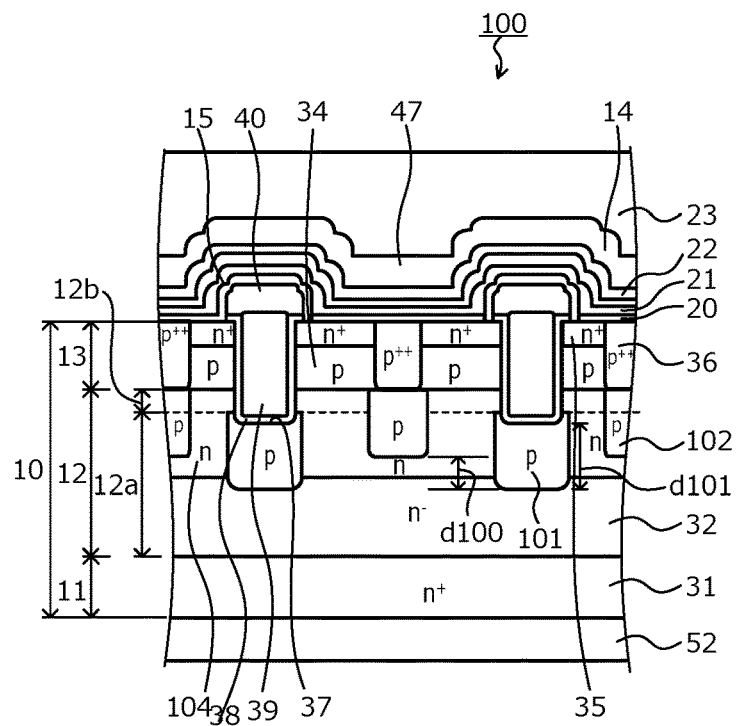
FIG. 22 is a cross-sectional view depicting a structure of a semiconductor device according to a fourth embodiment.
FIG. 23 is a cross-sectional view depicting the structure of the semiconductor device according to the fourth embodiment.

A structure of a semiconductor device according to a fourth embodiment is described. FIGS. 22 and 23 are cross-sectional views depicting the structure of the semiconductor device according to the fourth embodiment. FIGS. 22 and 23 depict cross-sections of the structure along cutting line C1-C1' and cutting line C2-C2' in FIG. 24, respectively. A layout when the semiconductor device 100 according to the fourth embodiment overall is viewed from the front side of the semiconductor substrate 10 is similar to that depicted in FIG. 1.

Figure 24:
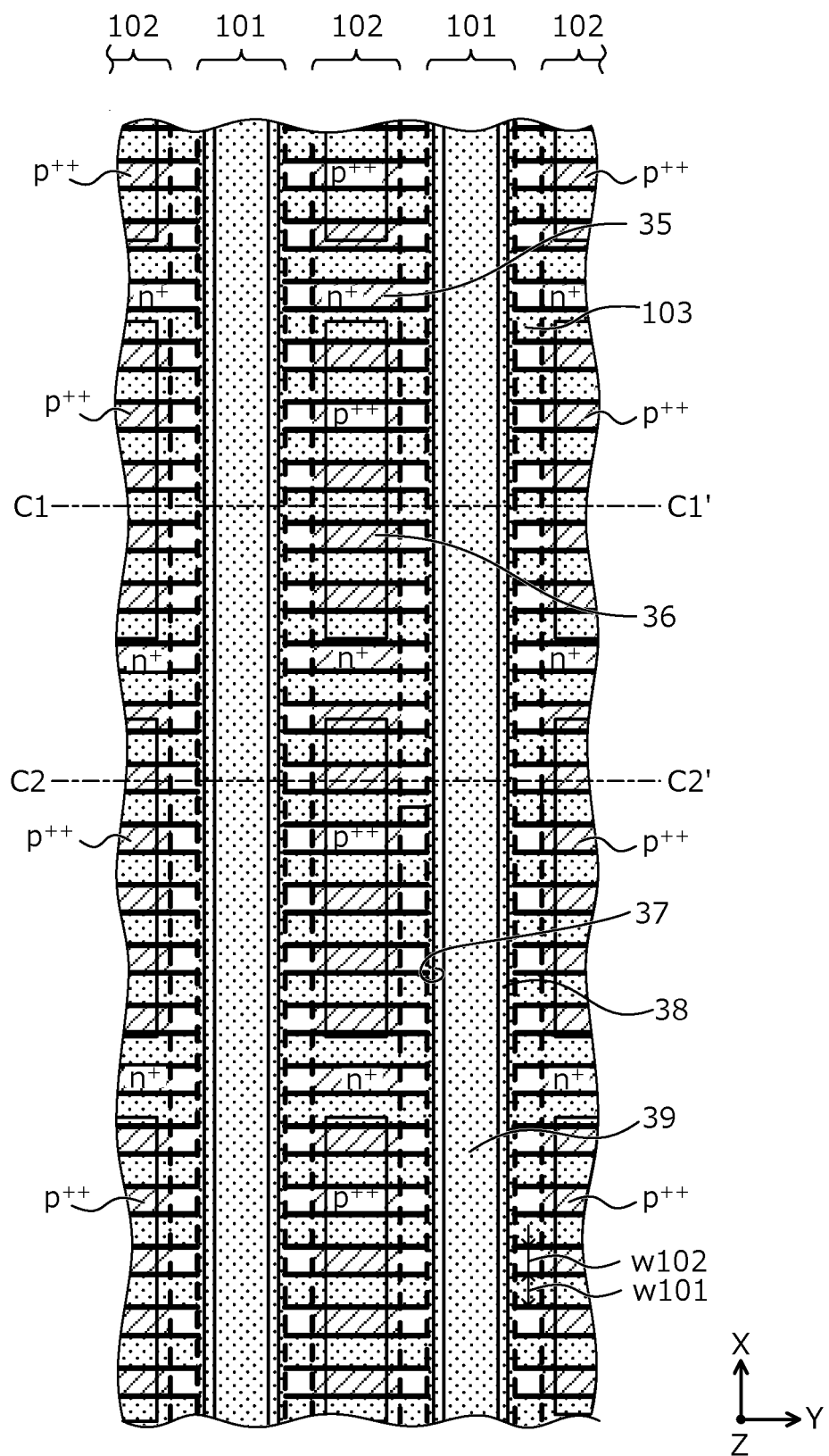
FIG. 24 is an enlarged plan view of a portion of the active region in FIG. 1.
Figure 25:
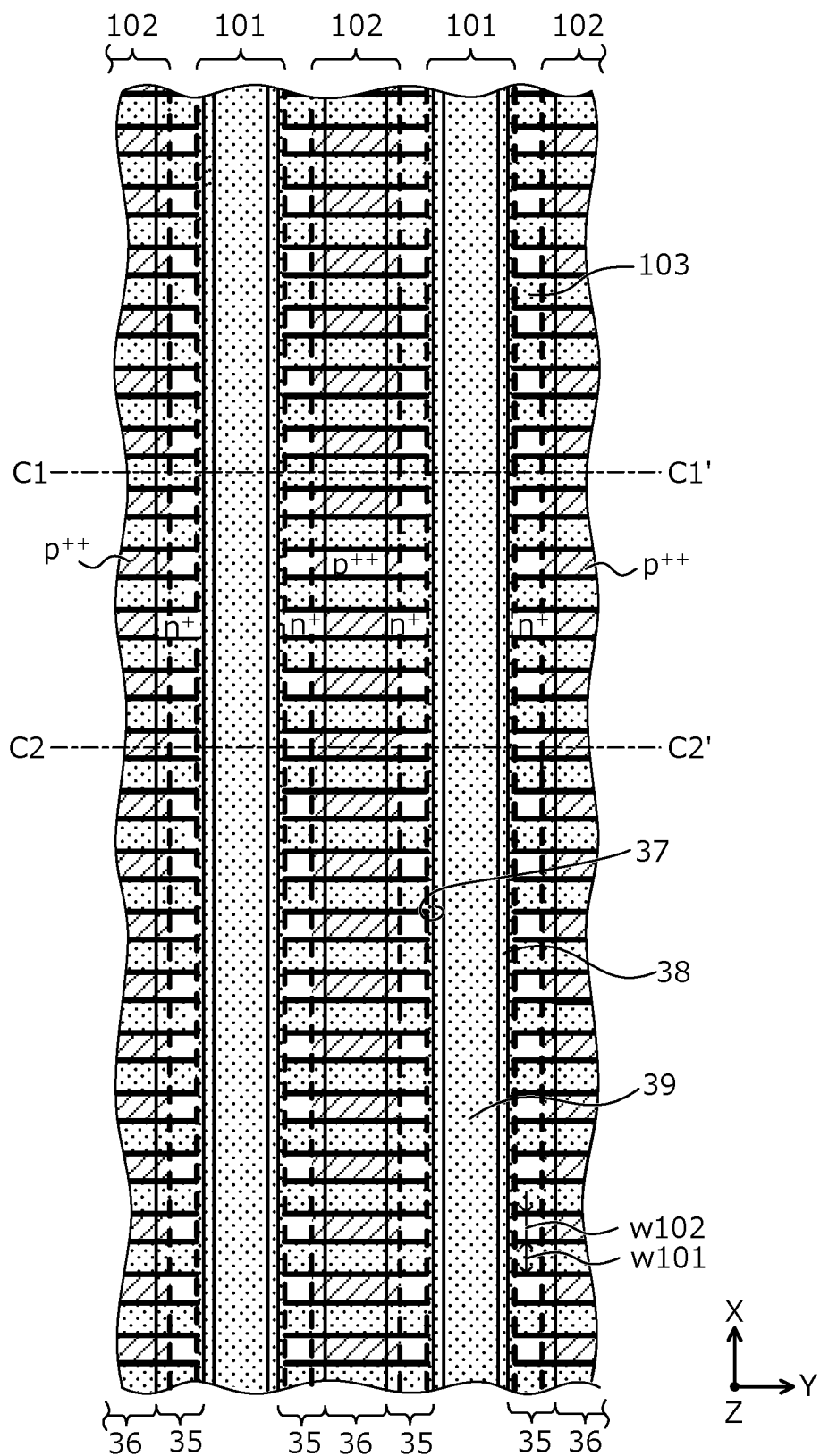
FIG. 25 is an enlarged plan view of a portion of another example of the active region in FIG. 1.

FIG. 24 is an enlarged plan view of a portion of the active region in FIG. 1. FIG. 25 is an enlarged plan view of a portion of another example of the active region in FIG. 1. FIGS. 24 and 25 depict layouts of p-type low-concentration regions 101 (portions outlined by thick broken lines and filled with dotted hatching), p-type low-concentration regions 102 (portions outlined by thick broken lines and filled with diagonal-lined hatching), and p-type low-concentration connecting portions 103 (portions outlined by thick solid lines and filled with dotted hatching).

The semiconductor device 100 according to the fourth embodiment differs from the semiconductor device 30 according to the first embodiment (refer to FIGS. 2 to 6) on the following 3 points. The first difference is that the $p^+$-type high-concentration regions 62, 64 are omitted (refer to FIG. 2) and only the p-type low-concentration regions (first low-concentration regions) 101 and the p-type low-concentration regions (second low-concentration regions) 102 are provided as p-type regions having a function of mitigating electric field applied to the gate insulating film 38 at the inner walls of the trenches 37.

The second difference is that lower surfaces (ends facing the $n^+$-type drain region 31) of the p-type low-concentration regions 102 between the trenches 37 that are adjacent to one another are at shallow positions that, in a direction toward the $n^+$-type source regions 35, are a distance d100 of, for example, at least about 0.1 μm from lower surfaces of the p-type low-concentration regions 101 that face the bottoms of the trenches 37. The third difference is that an impurity concentration of the p-type low-concentration regions 102 is, for example, at least about 10 times higher than an impurity concentration of the p-type low-concentration regions 101.

Other than the depths (thicknesses), depth positions, and impurity concentrations of the p-type low-concentration regions 101, 102, configurations thereof are similar, respectively, to configurations of the p-type low-concentration regions 61, 65 of the first embodiment (refer to FIG. 2). The p-type low-concentration regions 101 that are adjacent to one another are connected by the p-type low-concentration connecting portions 103. Other than the depth, depth position, and impurity concentration of the p-type low-concentration connecting portions 103, configuration thereof is similar to that of the p-type low-concentration connecting portions 63 of the first embodiment (refer to FIG. 3).

In particular, the p-type low-concentration regions 101 have a function of mitigating electric field applied to the gate insulating film 38 at the bottoms of the trenches 37. The p-type low-concentration regions 101 are provided between the p-type base region 34 and the $n^-$-type drift region 32, the p-type low-concentration regions 101 being separate from the p-type base region 34 and facing the bottoms of the trenches 37 in the depth direction Z. Each of the p-type low-concentration regions 101 extends in a linear shape in the first direction X and has a length substantially equal to the length of each of the trenches 37 in the longitudinal direction of the trenches 37.

The bottom surfaces of the p-type low-concentration regions 101 are positioned closer to the $n^+$-type drain region 31 than are the bottoms of the trenches 37. A depth (distance) d101 from the bottoms of the trenches 37 to the lower surfaces of the p-type low-concentration regions 101, for example, is in a range of about 0.7 μm to 1.1 μm. The p-type low-concentration regions 101 may reach a depth position substantially the same as that of n-type current spreading regions 104 or may reach a deep position closer to the $n^+$-type drain region 31 than are the n-type current spreading regions 104 to be in contact with the $n^-$-type drift region 32.

A width (width in the second direction Y) of each of the p-type low-concentration regions 101 is wider than the width of each of the trenches 37. The p-type low-concentration regions 101 face the bottoms and the bottom corner portions of the trenches 37. The p-type low-concentration regions 101 may be in contact with the gate insulating film 38 at the bottoms and the bottom corner portions of the trenches 37. An impurity concentration of the p-type low-concentration regions 101 is, for example, in a range of about $1 \times 10^{16}/cm^3$ to $8 \times 10^{16}/cm^3$.

The p-type low-concentration regions 102 have a function of mitigating electric field applied to the gate insulating film 38 at the sidewalls of the trenches 37. The p-type low-concentration regions 102 are provided between the trenches 37 that are adjacent to one another, the p-type low-concentration regions 102 being apart from the p-type low-concentration regions 101 and the trenches 37. Each of the p-type low-concentration regions 102 has a length in the first direction X substantially equal to the length of each of the trenches 37 in the longitudinal direction of the trenches 37 and extends in a linear shape in the first direction X so as to penetrate through the p-type low-concentration connecting portions 103.

The p-type low-concentration regions 102 have upper surfaces that are in contact with the $p^{++}$-type contact regions 36 or the p-type base region 34, and are electrically connected to the p-type base region 34. Lower surfaces of the p-type low-concentration regions 102 are at deep positions closer to the $n^+$-type drain region 31 than are the bottoms of the trenches 37. Further, the lower surfaces of the p-type low-concentration regions 102 are at shallow positions that, in a direction toward the $n^+$-type source regions 35, are the distance d100 of, for example, about 0.1 μm or more from the lower surfaces of the p-type low-concentration regions 101.

The impurity concentration of the p-type low-concentration regions 102 is at least about 10 times higher than the impurity concentration of the p-type low-concentration regions 101 and, for example, is in a range of about $1 \times 10^{17}/cm^3$ to $1 \times 10^{18}/cm^3$. The impurity concentration and the depth position of the lower surfaces of the p-type low-concentration regions 102 are set in this manner, whereby the lower surface corner portions (border between the lower surface and a side surface) of the p-type low-concentration regions 102 become locations where electric field concentrates in the active region 1 when the MOSFET (the semiconductor device 30) is off.

Similarly to the conventional structure (refer to FIGS. 17 to 20), when the impurity concentration of the first $p^+$-type high-concentration regions 261 that face the trenches 23 and the impurity concentration of the second $p^+$-type high-concentration regions 262 between the trenches 237 that are adjacent to one another are the same and the lower surfaces of the first $p^+$-type high-concentration regions 261 and of the second $p^+$-type high-concentration regions 262 are at the same depth position, avalanche breakdown easily occurs at the lower surface corner portions of the first $p^+$-type high-concentration regions 261 facing the trenches 237, when the MOSFET (the conventional semiconductor device 230) is off. Therefore, the trench gate structure is adversely affected significantly by large current that increased due to the avalanche breakdown.

In contrast, it was confirmed by the inventor that, in the fourth embodiment, when the MOSFET is off, electric field concentrates at the lower surface corner portions of the p-type low-concentration regions 102, which are apart from the trenches 37, and avalanche breakdown is facilitated at the lower surface corner portions of the p-type low-concentration regions 102. The occurrence of avalanche breakdown at the lower surface corner portions of the p-type low-concentration regions 101 that face the trenches 37 may be prevented, and adverse effects on the trench gate structure by large current that increased due to avalanche breakdown may be reduced.

The p-type low-concentration connecting portions 103 have a function of mitigating electric field applied to the gate insulating film 38 at the sidewalls of the trenches 37. The p-type low-concentration connecting portions 103 are provided between the trenches 37 that are adjacent to one another, the p-type low-concentration connecting portions 103 being in contact with and connecting the p-type low-concentration regions 101, 102 to one another. The p-type low-concentration connecting portions 103, for example, partially extend portions of the p-type low-concentration regions 102 in the second direction Y. An entire area of the upper surface of each of the p-type low-concentration connecting portions 103 is in contact with the p-type base region 34.

The p-type low-concentration connecting portions 103 are scattered along the first direction X. Each of the p-type low-concentration connecting portions 103 has, in a plan view thereof, for example, a substantially rectangular shape relatively longer in the second direction Y and extends to a vicinity of the trenches 37. The p-type low-concentration connecting portions 103 may extend to a vicinity of the trenches 37 so as to be in contact with or overlap the p-type low-concentration regions 101; the n-type current spreading regions 104 (or the $n^-$-type drift region 32) may be present between the p-type low-concentration connecting portions 103 and the trenches 37.

The n-type current spreading regions 104 between the p-type low-concentration connecting portions 103 and the trenches 37 constitute a path for current (drift current) that flows passing through channels when the MOSFET is on and therefore, the on-resistance may be reduced. A width (width in the first direction X) w101 of each of the p-type low-concentration connecting portions 103 is at least equal to a process limit (for example, about 0.5 μm). An interval w102 between the p-type low-concentration connecting portions 103 that are adjacent to one another in the first direction X is, for example, in a range of about 2 μm to 5 μm.

Lower surfaces of the p-type low-concentration connecting portions 103 may be at a depth position substantially the same as that of upper surfaces of the p-type low-concentration regions 101 or at a depth position closer to the $n^+$-type drain region 31 than are upper surfaces of the p-type low-concentration regions 101. In other words, the lower surfaces of the p-type low-concentration connecting portions 103 suffice to be at a depth position so that at least ends of the p-type low-concentration connecting portions 103 in the second direction Y are in contact with the p-type low-concentration regions 101 and may be at a depth position different from the depth position of the p-type low-concentration regions 102.

The p-type low-concentration connecting portions 103 may be formed concurrently with the p-type low-concentration regions 102; and the lower surfaces of the p-type low-concentration connecting portions 103 may be at the same depth position as that of the p-type low-concentration regions 102. The shallower is the depth (distance from the lower surface of the p-type base region 34 to the lower surfaces of the p-type low-concentration connecting portions 103) of the p-type low-concentration connecting portions 103, the shorter the time for an ion implantation process for forming the p-type low-concentration connecting portions 103 may be.

The p-type low-concentration connecting portions 103 may be formed concurrently with the p-type low-concentration regions 102 and the impurity concentration of the p-type low-concentration connecting portions 103 may be substantially equal to the impurity concentration of the p-type low-concentration regions 102. The impurity concentration of the p-type low-concentration connecting portions 103 suffices to be at least about 10 times higher than the impurity concentration of the p-type low-concentration regions 101, for example, in a range of about $1 \times 10^{17}/cm^3$ to $1 \times 10^{18}/cm^3$ and may be different from the impurity concentration of the p-type low-concentration regions 102.

The n-type current spreading regions 104 are provided between and in contact with the n$^-$-type drift region 32 and the p-type low-concentration connecting portions 103. The n-type current spreading regions 104 extend in the second direction Y to the p-type low-concentration regions 101 and are in contact with the p-type low-concentration regions 101. The n-type current spreading regions 104 extend between the p-type low-concentration connecting portions 103, the p-type low-concentration regions 102, and the trenches 37 and reach the p-type base region 34, the upper surfaces of the n-type current spreading regions 104 being in contact with the p-type base region 34.

JFET resistance of the n-type current spreading regions 104 is formed between the p-type low-concentration regions 101 and the p-type low-concentration regions 102. The lower surfaces of the p-type low-concentration regions 102 are at shallow positions that, in a direction toward the n$^+$-type source regions 35, are the distance d100 from the lower surfaces of the p-type low-concentration regions 101, whereby reduction of the cell pitch is possible. The n-type current spreading regions 104 may be omitted and instead of the n-type current spreading regions 104, the n$^-$-type drift region 32 may reach the p-type base region 34.

The layout of the n$^+$-type source regions 35 and the p$^{++}$-type contact regions 36 may be suitably changed. For example, similarly to the first embodiment, in a plan view, the n$^+$-type source regions 35 may be disposed in grid-like shape surrounding the peripheries of the p$^{++}$-type contact regions 36, which are scattered along the first direction X (FIG. 24), or the n$^+$-type source regions 35 and the p$^{++}$-type contact regions 36 may both extend in linear shapes along the first direction X (FIG. 25).

A method of manufacturing the semiconductor device 100 according to the fourth embodiment may be implemented by forming, at predetermined depth positions, the p-type low-concentration regions 101, the p-type low-concentration regions 102, the p-type low-concentration connecting portions 103, and the n-type current spreading regions 104 instead of the p-type low-concentration regions 61, 65, the p$^+$-type high-concentration regions 62, 64, the p-type low-concentration connecting portions 63, and the n-type current spreading regions 33 in the method of manufacturing the semiconductor device 30 according to the first embodiment (refer to FIGS. 7 to 12).

In the semiconductor device 100 according to the fourth embodiment, the edge termination region 2 and the intermediate region 3 in FIG. 14 may be applied.

As described above, according to the fourth embodiment, compared to the p-type low-concentration regions that face the bottoms of the trenches, the p-type low-concentration regions between the trenches that are adjacent to one another are shallow so that the distance between the lower surfaces thereof and the bottoms of the trenches in a direction toward the n$^+$-type source regions is, for example, about 0.1 µm or more, and the impurity concentration of the p-type low-concentration regions is at least 10 times higher. As a result, the structure is such that when the MOSFET is off, avalanche breakdown is facilitated at the lower surface corner portions of the p-type low-concentration regions between the trenches that are adjacent to one another.

Due to this structure, adverse effects on the trench gate structure by large current that increases due to avalanche breakdown may be reduced. For example, an application of high electric field to the gate insulating film due to large current that increases due to avalanche breakdown may be suppressed. The electric field applied to the gate insulating film is mitigated, whereby optimization is possible by reducing the cell pitch and the on-resistance may also be reduced.

Therefore, according to the fourth embodiment, electric field applied to the gate insulating film may be mitigated and the on-resistance may be reduced by optimization through reducing the cell pitch. Therefore, effects similar to those of the first and the second embodiments may be obtained without providing the p$^+$-type high-concentration regions between the p-type base regions and the p-type low-concentration regions between the trenches that are adjacent to one another, or between the bottoms of the trenches and the p-type low-concentration regions facing the bottoms of the trenches.

Figure 26:
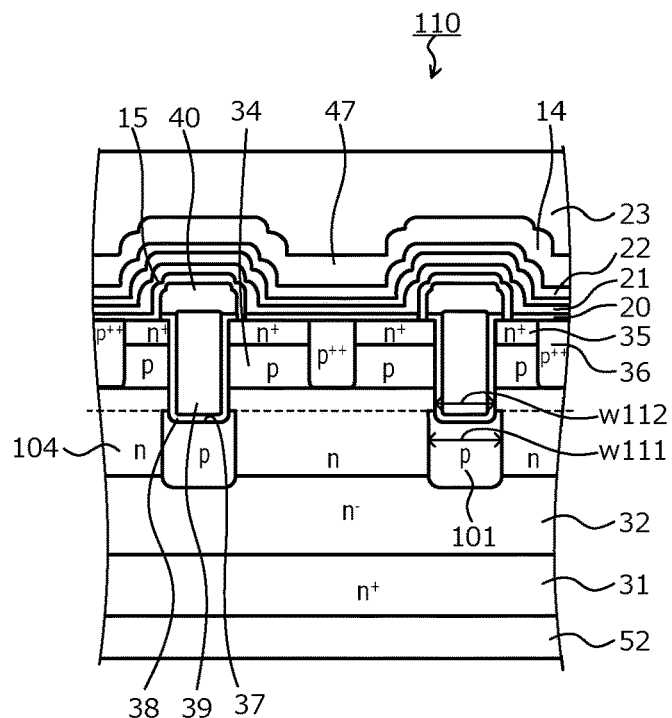
FIG. 26 is a cross-sectional view depicting a structure of a semiconductor device according to a fifth embodiment.
Figure 27:
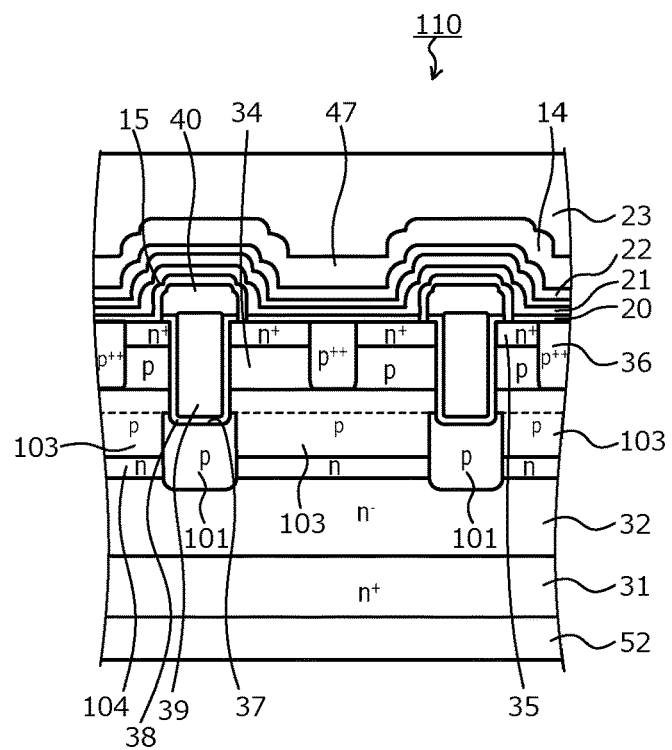
FIG. 27 is a cross-sectional view depicting the structure of the semiconductor device according to the fifth embodiment.

A structure of a semiconductor device according to a fifth embodiment is described. FIGS. 26 and 27 are cross-sectional views depicting the structure of the semiconductor device according to the fifth embodiment. FIGS. 26 and 27 depict cross-sections of the structure along cutting line D1-D1' and cutting line D2-D2' in FIG. 28, respectively. A layout when a semiconductor device 110 according to the fifth embodiment is viewed overall from the front side of the semiconductor substrate 10 is similar to that depicted in FIG. 1.

Figure 28:
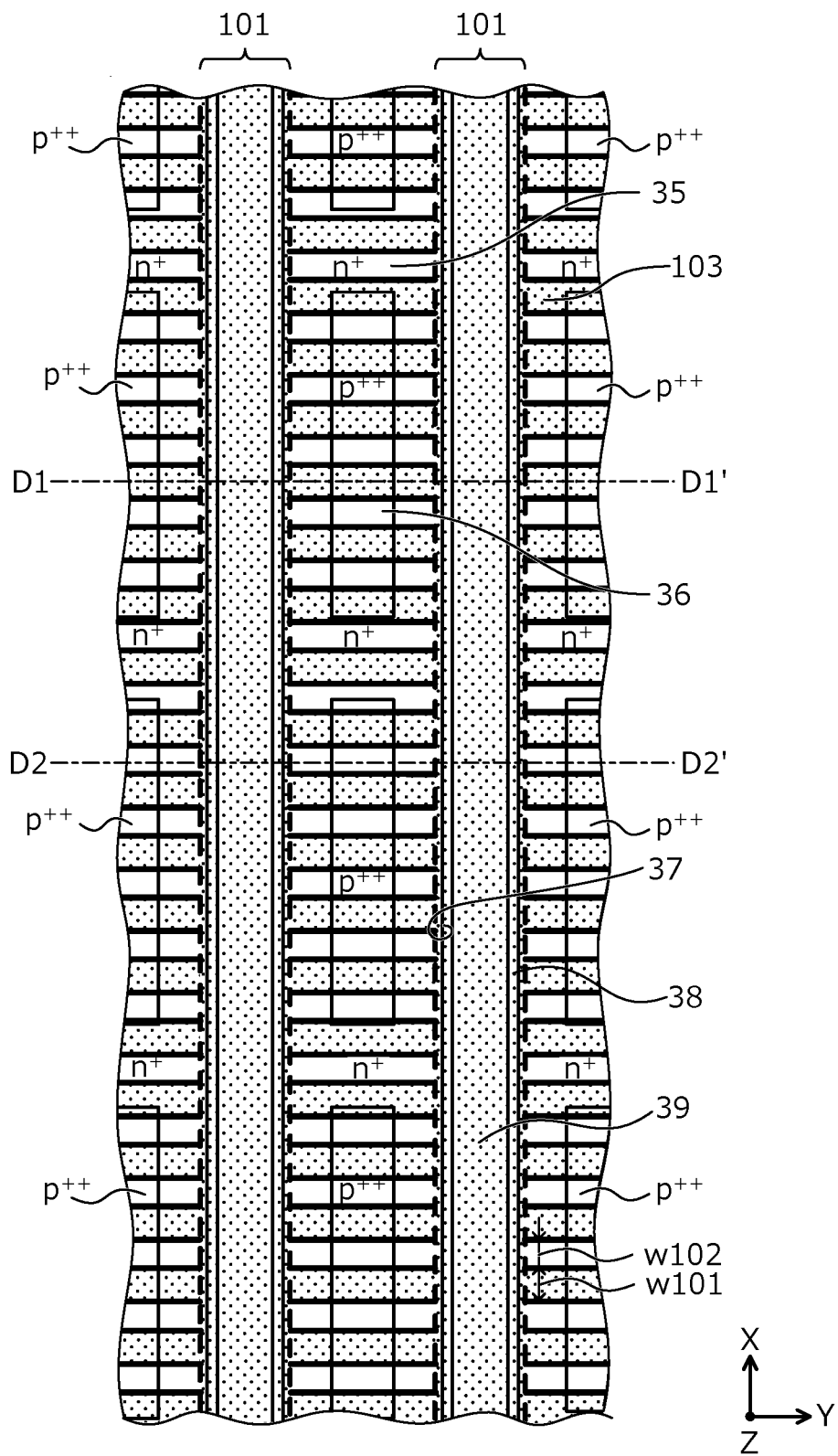
FIG. 28 is an enlarged plan view of a portion of the active region depicted in FIG. 1.
Figure 29:
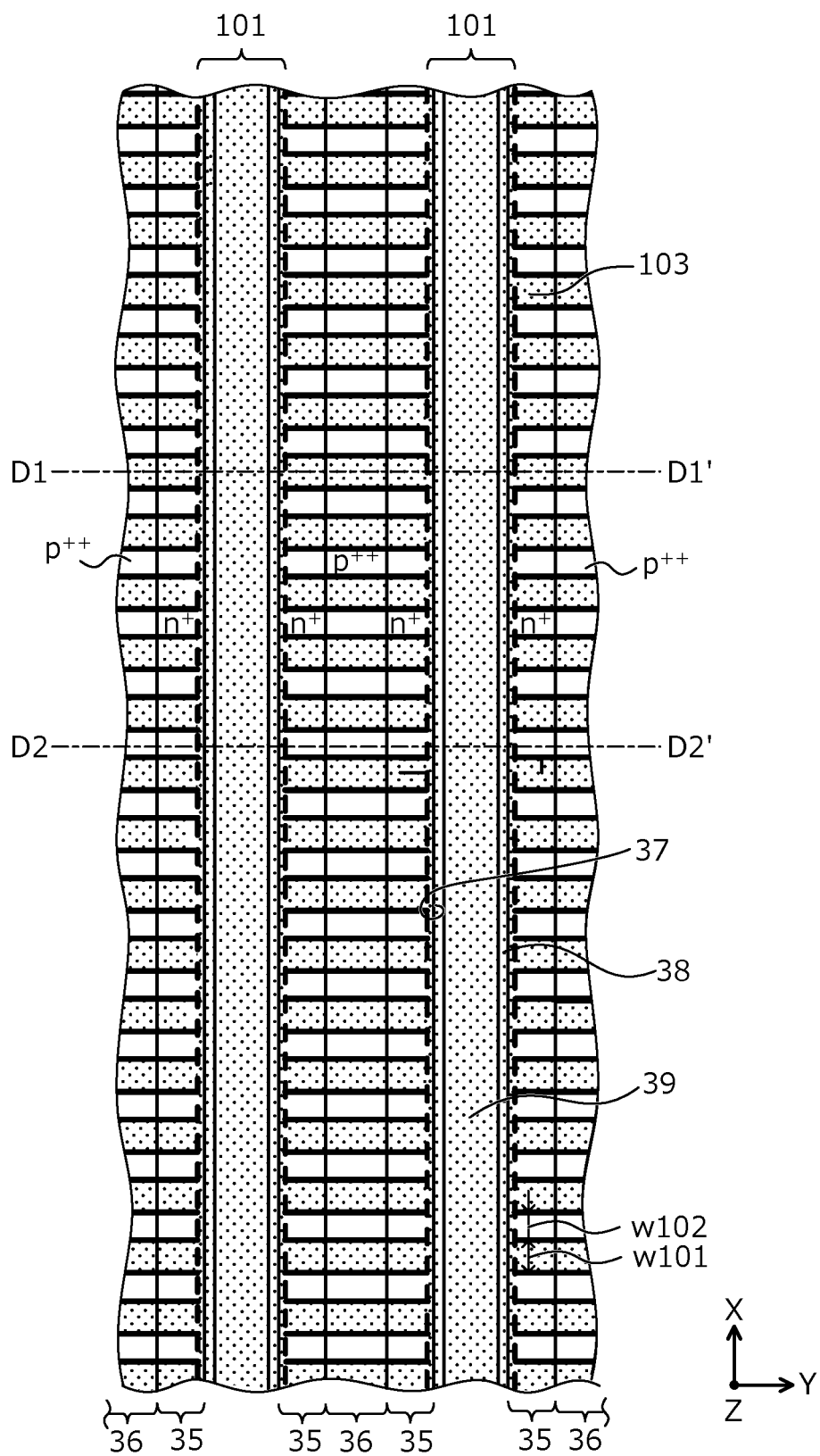
FIG. 29 is an enlarged plan view of a portion of another example of the active region in FIG. 1.

FIG. 28 is an enlarged plan view of a portion of the active region depicted in FIG. 1. FIG. 29 is an enlarged plan view of a portion of another example of the active region in FIG. 1. FIGS. 28 and 29 depict layouts of the p-type low-concentration regions 101 (portions outlined by a thick broken line and hatched with dots) and the p-type low-concentration connecting portions 103 (portions outlined by thick solid lines and hatched with dots).

The semiconductor device 110 according to the fifth embodiment differs from the semiconductor device 100 according to the fourth embodiment (refer to FIGS. 22 to 25) on the following 2 points. The first difference is that the p-type low-concentration regions between the trenches 37 that are adjacent to one another (reference numeral 102 in FIGS. 22 and 23) are omitted and only the p-type low-concentration regions 101 and the p-type low-concentration connecting portions 103 are provided as p-type regions having a function of mitigating electric field applied to the gate insulating film 38 at the inner walls of the trenches 37.

Between the trenches 37 that are adjacent to one another, p-type regions disposed beneath (at side facing the n$^+$-type drain region 31) the p-type base region 34 and the p$^{++}$-type contact regions 36 (in an instance in which the p$^{++}$-type contact regions 36 are omitted, only the p-type base region 34) include only the p-type low-concentration connecting portions 103. As a result, the path for current (drift current) that flows passing through channels when the MOSFET is on widens.

The extent to which the width of this current path is increased, the cell pitch is reduced (a state in which the cell pitch of the semiconductor device 110 according to the fifth embodiment is reduced is not depicted) and the on-resistance may be reduced. In this manner, while reduction of the on-resistance becomes possible, the cell pitch is reduced, whereby the interval between the trenches 37 that are adjacent to one another decreases and the resistance value of the JFET resistance increases, whereby the strength of the electric field applied to the gate insulating film 38 at the sidewalls of the trenches 37 increases.

Thus, the second difference is that a width (width in the second direction Y) w111 of the p-type low-concentration regions 101 facing the trenches 37 is set to be wider than a width w112 of the trenches 37 and is about 1.0 μm or more. As a result, it was confirmed by the inventor that an interval between isopotential lines near upper corner portions (borders between the upper surface and sides surfaces) of the p-type low-concentration regions 101 becomes wider and the electric field applied to the gate insulating film 38 at the sidewalls of the trenches 37 is mitigated (refer to later-described FIG. 30).

Further, the inventor confirmed that the wider is the width w111 of the p-type low-concentration regions 101, the strength of the electric field applied to the gate insulating film 38 at the sidewalls of the trenches 37 approaches a constant value independent of the withstand voltage (refer to later-described FIGS. 31 and 32). For example, in an instance in which the width w112 of the trenches 37 is about 0.7 μm, the width w111 of the p-type low-concentration regions 101 is about 1.0 μm. The width w111 of the p-type low-concentration regions 101 increases or decreases in proportion to the width w112 of the trenches 3.

The impurity concentration of the p-type low-concentration regions 101 is the same as that in the fourth embodiment (i.e., for example, in a range of about $1 \times 10^{16}$/cm$^3$ to $8 \times 10^{16}$/cm$^3$). In the fifth embodiment, impurity concentrations of the p-type low-concentration regions 101 and the p-type low-concentration connecting portions 103 may be set within a range (i.e., for example, a range of about $3 \times 10^{17}$/cm$^3$ to $9 \times 10^{17}$/cm$^3$) of the impurity concentration of the p-type low-concentration regions 61 in the first embodiment.

A layout of the n$^+$-type source regions 35 and the p$^{++}$-type contact regions 36 in a plan view may be a layout in which, similarly to the fourth embodiment, the n$^+$-type source regions 35 are disposed in a grid-like shape surrounding the peripheries of the p$^{++}$-type contact regions 36 that are scattered along the first direction X (FIG. 28), or may be a layout in which the n$^+$-type source regions 35 and the p$^{++}$-type contact regions 36 both extend in linear shapes along the first direction X (FIG. 29).

A method of manufacturing the semiconductor device 110 according to the fifth embodiment may be implemented by omitting, in the method of manufacturing the semiconductor device 100 according to the fourth embodiment, the process of forming the p-type low-concentration regions 102 between the trenches 37 that are adjacent to one another.

The edge termination region 2 and the intermediate region 3 in FIG. 14 may be applied to the semiconductor device 110 according to the fifth embodiment.

As described above, according to the fifth embodiment, no p-type low-concentration regions are between the trenches that are adjacent to one another, whereby the on-resistance may be reduced by the shortening of the cell pitch. Further, the width of the p-type low-concentration regions that face the trenches is increased, whereby electric field applied to the gate insulating film at the sidewalls of the trenches may be mitigated. Therefore, effects similar to those of the fourth embodiment may be obtained without providing the p-type low-concentration regions between the trenches that are adjacent to one another.

Figure 30:
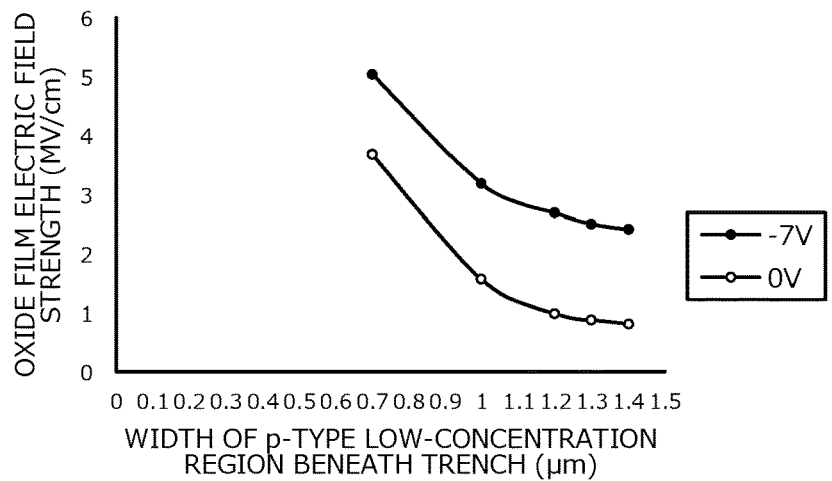
FIG. 30 is a characteristics diagram depicting results of simulating electric field strength of a gate insulating film in a second example.

Relationships between the width w111 of the p-type low-concentration regions 101 facing the trenches 37, the strength of the electric field applied to the gate insulating film 38 at the sidewalls of the trenches 37 during the off state, and the withstand voltage (breakdown voltage) were verified for the semiconductor device 110 according to the fifth embodiment (refer to FIGS. 26 to 29, hereinafter, second example). FIGS. 30, 31, and 32 are characteristics diagrams depicting results of simulating electric field strength of the gate insulating film in the second example.

In FIG. 30, a horizontal axis indicates the width w111 [μm] of the p-type low-concentration regions 101 (the p-type low-concentration regions beneath the trenches) facing the trenches 37. In FIGS. 31 and 32, horizontal axes indicate withstand voltage [V] (breakdown voltage applied to the gate insulating film 38 during avalanche breakdown). In FIGS. 30 to 32, vertical axes indicate the strength (oxide film electric field strength [MV/cm]) of the electric field applied to the gate insulating film 38 at the sidewalls of the trenches 37.

For the second example, results of simulating the strength of the electric field applied to the gate insulating film 38 at the sidewalls of the trenches 37 by variously changing the width w111 of the p-type low-concentration regions 101 facing the trenches 37 are shown in FIG. 30. FIG. 30 shows two samples, an instance in which a gate voltage VG was 0V and an instance in which the gate voltage VG was −7V, while 700V (voltage applied to the gate insulating film 38) was applied in a forward direction between the source and drain in the second example.

Figure 31:
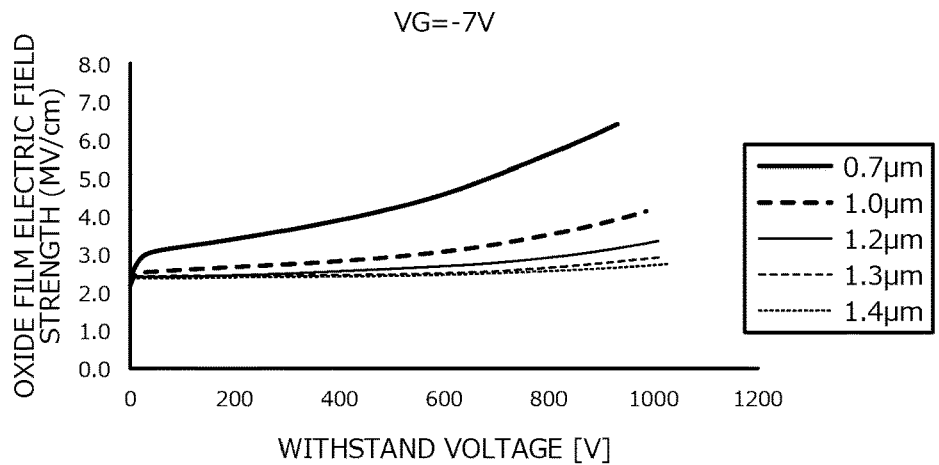
FIG. 31 is a characteristics diagram depicting results of simulating electric field strength of the gate insulating film in the second example.
Figure 32:
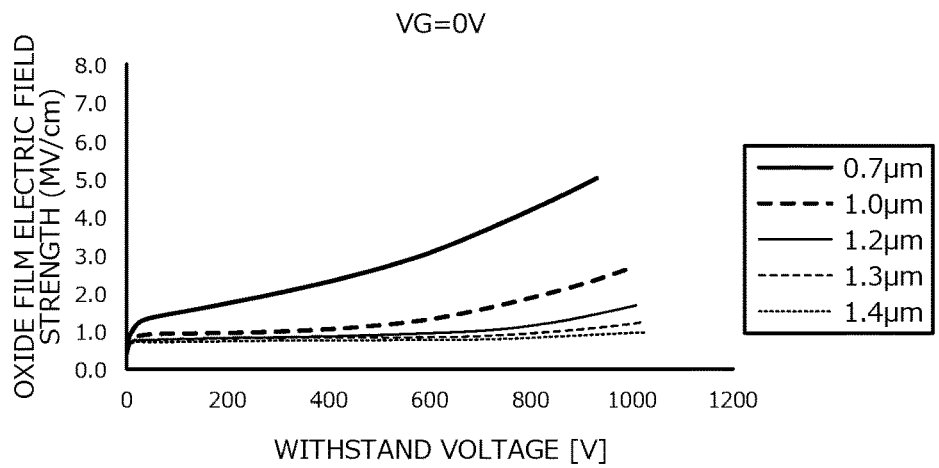
FIG. 32 is a characteristics diagram depicting results of simulating electric field strength of the gate insulating film in the second example.

Further, for the two samples (the sample for which the gate voltage VG was −7V and the sample for which the gate voltage VG was 0V) of the second example, the strength of the electric field applied to the gate insulating film 38 at the sidewalls of the trenches 37 was simulated by variously changing the width w111 of the p-type low-concentration regions 101 that face the trenches 37 and the withstand voltage (breakdown voltage applied to the gate insulating film 38, maximum: about 1000V), and results of the simulation are shown in FIGS. 31 and 32, respectively.

From the results shown in FIGS. 30 to 32, it was confirmed that the wider is the width w111 of the p-type low-concentration regions 101, the greater the strength of the electric field applied to the gate insulating film 38 at the sidewalls of the trenches 37 during the off state may be reduced in the second example. Further, the relationship between the width w111 of the p-type low-concentration regions 101 and the strength of the electric field applied to the gate insulating film 38 at the sidewalls of the trenches 37 during the off state was confirmed to have the same tendency independent of the gate voltage VG (≤0 V) and the withstand voltage.

In particular, independent of the gate voltage VG and the withstand voltage, the width w111 of the p-type low-concentration regions 101 is at least 1.0 µm, whereby the electric field applied to the gate insulating film 38 at the sidewalls of the trenches 37 tends to be significantly mitigated. Nonetheless, it is known that the wider is the width w111 of the p-type low-concentration regions 101, the greater the on-resistance increases and therefore, the width w111 of the p-type low-concentration regions 101 suffices to be set within a range of 1.0 µm to 1.4 µm so that a predetermined on-resistance is obtained. In other words, with universalization of the width w112 of the trenches 37, the width w111 of the p-type low-concentration regions 101 with respect to the width w112 of the trenches 37 (=w111/w112) suffices to be set within a range of 1.4 to 2 times thereof.

In the foregoing, the present invention, without limitation to the embodiments described above, may be variously modified within a range not departing from the spirit of the invention. For example, in the first and the second embodiment, the FLRs may be formed at a timing different from those for the p-type low-concentration regions that mitigate the electric field applied to the gate insulating film at the bottoms of the trenches, the p-type low-concentration connecting portions, and the p$^+$-type high-concentration regions. In the third embodiment, the n$^-$-type epitaxial layer may be exposed at the front surface of the semiconductor substrate in the edge termination region or the front surface of the semiconductor substrate may be from the active region to the chip end without providing the recess. The present invention is further applicable in an instance in which instead of silicon carbide as a semiconductor material, a wide band gap semiconductor other than silicon carbide is used. Further, the present invention is similarly implemented when the conductivity types (n-type, p-type) are reversed.

According to the invention described above, the width of the first low-concentration regions that face the trenches may be reduced. As a result, the resistance value of the JFET resistance, which is internal resistance of the semiconductor substrate, may be reduced or the unit cells may be reduced in size and the unit cell density may be increased. Further, according to the invention described above, even when the impurity concentration of the first low-concentration regions is low, the depletion layer that spreads from the main junctions (pn junctions) in the off state does not easily spread in the first high-concentration regions that are between the bottoms of the trenches and the first low-concentration regions. Further, the total concentration of the second-conductivity-type impurity per predetermined area near the bottoms of the trenches increases depending on the distance between the first connecting portions, whereby the first low-concentration regions are not easily depleted.

The semiconductor device according to the present invention achieves an effect in that electric field applied to the gate insulating film is mitigated and the on-resistance may be reduced.

As described above, the semiconductor device according to the present invention is useful for power semiconductor devices that control high voltage and/or large current.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
    a semiconductor substrate containing a semiconductor having a band gap that is wider than a band gap of silicon, the semiconductor substrate having a first main surface and a second main surface that are opposite to each other;
    a first semiconductor region of a first conductivity type, provided in the semiconductor substrate;
    a second semiconductor region of a second conductivity type, provided between the first main surface of the semiconductor substrate and the first semiconductor region;
    a plurality of third semiconductor regions of the first conductivity type, selectively provided between the first main surface of the semiconductor substrate and the second semiconductor region;
    a plurality of trenches penetrating through, in a depth direction of the semiconductor device, the third semiconductor regions and the second semiconductor region and reaching the first semiconductor region, the trenches being provided in a striped pattern extending in a first direction that is parallel to the first main surface of the semiconductor substrate;
    a plurality of gate electrodes provided in the trenches via a gate insulating film;
    a first electrode electrically connected to the second semiconductor region and the third semiconductor regions;
    a second electrode provided on the second main surface of the semiconductor substrate;
    a plurality of first low-concentration regions of the second conductivity type, selectively provided in the first semiconductor region, each of the first low-concentration regions facing a respective one of bottoms of the trenches; and
    a plurality of first connecting portions of the second conductivity type, each of the first connecting portions connecting an adjacent two of the first low-concentration regions in a second direction that is parallel to the first main surface of the semiconductor substrate and orthogonal to the first direction, wherein
    the first low-concentration regions and the first connecting portions are electrically connected to the second semiconductor region, and
    the first low-concentration regions extend linearly in the first direction, the first low-concentration regions forming a grid-like pattern with the first connecting portions in a plan view of the semiconductor device.

2. The semiconductor device according to claim 1, wherein
    each of the first low-concentration regions has a first end facing a respective one of the trenches and a second end facing the second electrode, and a distance from the respective trench to the second end is in a range of 0.7 µm to 1.1 µm.

3. The semiconductor device according to claim 1, further comprising
    a plurality of first high-concentration regions of the second conductivity type, each of the first high-concentration regions electrically connecting a respective one of the first low-concentration regions to the second semiconductor region and having an impurity concentration that is higher than an impurity concentration of the second semiconductor region.

4. The semiconductor device according to claim 3, wherein
the first low-concentration regions and the first connecting portions each have an impurity concentration in a range of $3\times10^{17}/cm^3$ to $9\times10^{17}/cm^3$.

5. The semiconductor device according to claim 3, wherein
an interval between an adjacent two of the first connecting portions in the first direction is 3 µm or less.

6. The semiconductor device according to claim 3, wherein
each of the first connecting portions has a width in the first direction in a range of 0.5 µm to 1.0 µm.

7. The semiconductor device according to claim 3, further comprising
a plurality of second high-concentration regions of the second conductivity type, provided between the bottoms of the trenches and the first low-concentration regions facing the bottoms, respectively, each of the second high-concentration regions being in contact with a respective one of the first low-concentration regions and having an impurity concentration that is higher than an impurity concentration of the first low-concentration regions and the impurity concentration of the second semiconductor region.

8. The semiconductor device according to claim 7, wherein
the impurity concentration of the second high-concentration regions is at least two times the impurity concentration of the first low-concentration regions.

9. The semiconductor device according to claim 7, wherein
the second high-concentration regions are in direct contact with the gate insulating film at the bottoms of the trenches, and
each of the second high-concentration regions has an end facing the second electrode and a distance between the end and a bottom of a respective one of the trenches is in a range of 0.1 µm to 0.15 µm.

10. The semiconductor device according to claim 3, wherein
the first high-concentration regions are provided in the first semiconductor region, separate from the first low-concentration regions and the trenches, extending in a striped pattern in the first direction, each of the first high-concentration regions being provided between a respective adjacent two of the trenches.

11. The semiconductor device according to claim 10, wherein
the first low-concentration regions are electrically connected to the first high-concentration regions via the first connecting portions.

12. The semiconductor device according to claim 3, wherein
the first high-concentration regions are provided at intervals in only one sidewall of each of the trenches along the first direction.

13. The semiconductor device according to claim 12, wherein
each of the intervals of the first high-concentration regions along the first direction is wider than an interval between the first connecting portions in the first direction.

14. The semiconductor device according to claim 1, further comprising
a plurality of second low-concentration regions of the second conductivity type, provided in the first semiconductor region, in contact with the second semiconductor region and the first connecting portions but apart from the first low-concentration regions and the trenches, the second low-concentration regions extending in a striped pattern in the first direction, each of the second low-concentration regions being between a respective adjacent two of the trenches, wherein
each of the first low-concentration regions has an end that faces the second electrode, each of the second low-concentration regions has an end that faces the second electrode and that is closer to the first electrode than is the end of the each of the first low-concentration regions, and a distance between the end of the each of the second low-concentration regions and the end of the each of the first low-concentration regions is at least 0.1 µm, and
the second low-concentration regions have an impurity concentration that is at least 10 times higher than an impurity concentration of the first low-concentration regions.

15. The semiconductor device according to claim 1, wherein
each of the first low-concentration regions has a width that is wider than a width of each of the trenches and that is at least 1.0 µm.

16. The semiconductor device according to claim 14, wherein
the impurity concentration of the first low-concentration regions is in a range of $1\times10^{16}/cm^3$ to $8\times10^{16}/cm^3$.

17. The semiconductor device according to claim 14, wherein
the first connecting portions have an impurity concentration that is at least 10 times higher than the impurity concentration of the first low-concentration regions.

18. The semiconductor device according to claim 14, wherein
the first connecting portions are in direct contact with the second semiconductor region and electrically connect the second semiconductor region and the first low-concentration regions.

19. The semiconductor device according to claim 14, wherein
the first connecting portions are provided adjacent to one another in the first direction, and an interval between any adjacent two of the first connecting portions is in a range of 2 µm to 5 µm.

* * * * *